(12) United States Patent
Nishizawa et al.

(10) Patent No.: US 7,557,307 B2
(45) Date of Patent: Jul. 7, 2009

(54) ELECTRONIC COMPONENT AND ITS MANUFACTURING METHOD

(75) Inventors: Yoshihiko Nishizawa, Yasu (JP); Tetsuya Ikeda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/755,108

(22) Filed: May 30, 2007

(65) Prior Publication Data

US 2007/0221399 A1 Sep. 27, 2007

Related U.S. Application Data

(63) Continuation of application No. PCT/JP2005/021762, filed on Nov. 28, 2005.

(30) Foreign Application Priority Data

Dec. 2, 2004 (JP) .............................. 2004-350485

(51) Int. Cl.
*H05K 9/00* (2006.01)

(52) U.S. Cl. ...................... 174/384; 361/816; 174/377; 174/520; 257/659

(58) Field of Classification Search ................ 174/520, 174/521, 350, 377, 384; 361/816, 818; 257/659
See application file for complete search history.

(56) References Cited

U.S. PATENT DOCUMENTS 6,462,271 B2 * 10/2002 Coffin et al. ................ 174/550
2002/0053449 A1 * 5/2002 Carden et al. .............. 174/52.1

FOREIGN PATENT DOCUMENTS

| JP | 1-86269 U | 6/1989 |
| JP | 03-034445 A | 2/1991 |
| JP | 06-350280 A | 12/1994 |
| JP | 07-142630 A | 6/1995 |
| JP | 07-193160 A | 7/1995 |
| JP | 07-202372 A | 8/1995 |
| JP | 08-153822 A | 6/1996 |
| JP | 08-250615 A | 9/1996 |
| JP | 11-354663 A | 12/1999 |
| JP | 2000-236045 A | 8/2000 |
| JP | 2004-031745 A | 1/2004 |

OTHER PUBLICATIONS

Official Communication for PCT Application No. PCT/JP2005/021762; mailed on Jan. 17, 2006.
Official communication issued in counterpart Chinese Application No. 2005800407411, mailed on May 9, 2008.

* cited by examiner

*Primary Examiner*—Hung V Ngo
(74) *Attorney, Agent, or Firm*—Keating & Bennett, LLP

(57) ABSTRACT

An electronic component includes a wiring board having a wiring pattern, a surface mount device mounted on an upper surface of the wiring board, and a cap arranged to cover the wiring board. The cap includes a top portion made of a flat ceramic member, and a leg portion made of a columnar member having a height similar to a height of the surface mount devices.

10 Claims, 18 Drawing Sheets

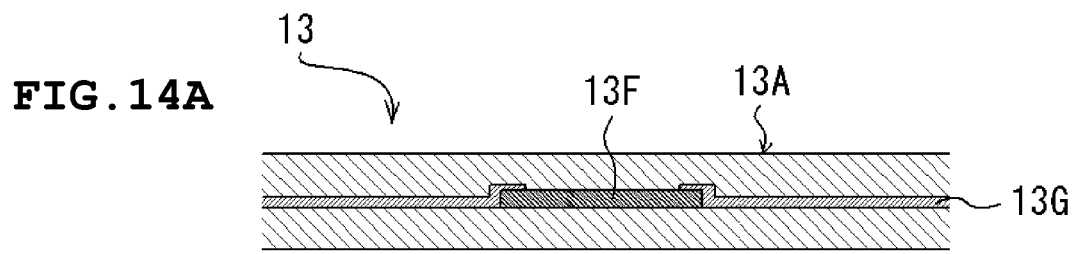
FIG.14A
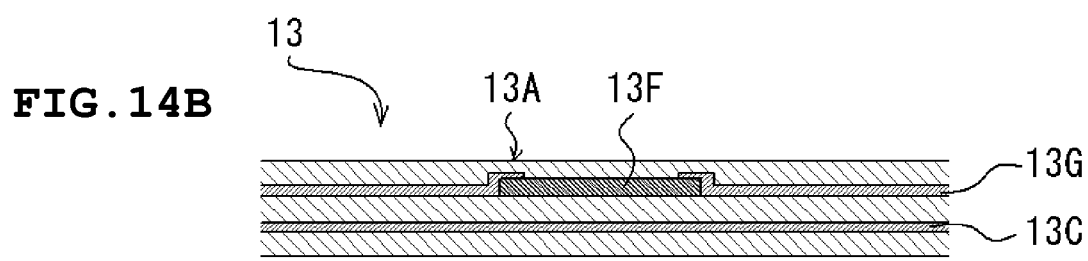
FIG.14B
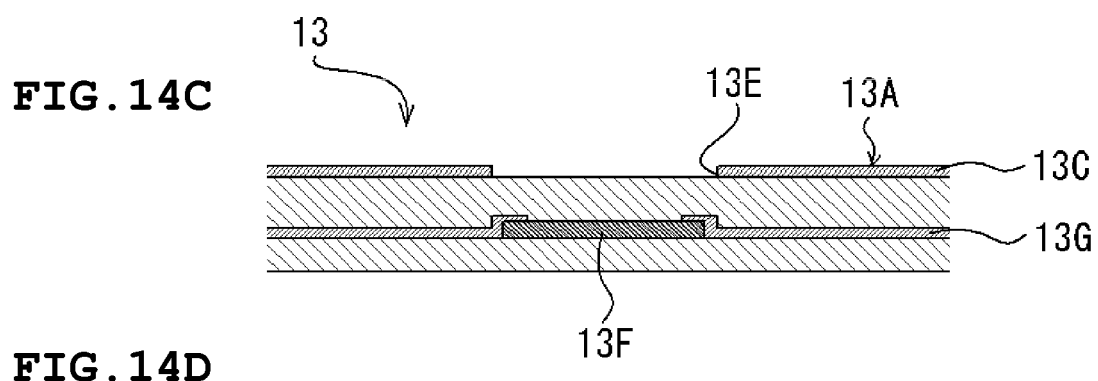
FIG.14C
FIG.14D
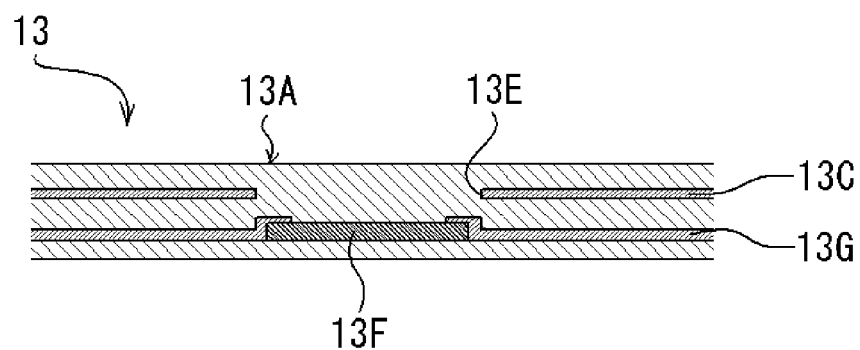

ELECTRONIC COMPONENT AND ITS MANUFACTURING METHOD

BACKGROUND OF THE INVENTION

1. Field of the Invention

The present invention relates to an electronic component in which surface mount devices mounted on a wiring board are covered with a cover member, and a manufacturing method of the electronic component. More particularly, the present invention relates to an electronic component which can be miniaturized and which can have a reduced height due to the improved structure of a cover member, and a manufacturing method of the electronic component.

2. Description of the Related Art

Known technologies are disclosed in Japanese Unexamined Patent Application Publication No. 6-350280 (Patent Document 1), Japanese Unexamined Patent Application Publication No. 8-250615 (Patent Document 2), and Japanese Unexamined Patent Application Publication No. 11-354663 (Patent Document 3).

Patent Document 1 discloses a hybrid IC with a metal shield case mounted on a ceramic board. The hybrid IC includes a ceramic board having a wiring pattern, and electronic components, such as a microcomputer, a transistor, and an IC, mounted on either side or both sides of the ceramic board. The ceramic board has a plurality of connection terminals extending perpendicularly downward from the outer peripheral edge thereof. The metal shield case made by bending both ends of a rectangular plate is mounted on the upper surface of the ceramic board, so as to block external noise. The shield case also functions as a sucking surface for picking up the hybrid IC for placement on a mother board.

Patent Document 2 discloses a ceramic package for a semiconductor chip, the ceramic package including a ceramic cover member having a box-like shape. The ceramic package for the semiconductor chip includes a ceramic package base on which a semiconductor chip is mounted, and the ceramic cover member for covering the package base. A copper plate layer is provided on the inner surface of the cover member, a sealing solder layer is provided on a sealed surface with a copper plate layer interposed therebetween, and the copper plate layer on the sealed surface is electrically connected to the copper plate layer on the inner surface. Also, a ground electrode is provided on the sealed surface of the package base, and the package base is sealed, with the sealing solder layer of the cover member interposed.

Accordingly, the copper plate layer on the sealed surface of the cover member is electrically connected to the ground electrode of the package base to function as a ground electrode layer, and the copper plate layer on the inner surface of the cover member functions as an electromagnetic shield layer.

Patent Document 3 discloses a sealing cover member for a semiconductor device and its manufacturing method. The sealing cover member has a multilayered structure including a plurality of ceramic layers. A shield layer is provided at an inner layer by wide area printing with paste. The back surface of the ceramic cover member and a board body facing the back surface are bonded by a binder paste, and thus, the cavity of the board body is sealed. Chip components may be mounted on both front and back surfaces of the ceramic cover member.

However, with the configuration disclosed in Patent Document 1, when the shield case has a reduced thickness so as to reduce the height of the electronic component such as the hybrid IC, it is difficult to perform accurate processing of the shield case, for example, by bending because the shield case is made of metal. In addition, the shield case may be markedly deformed due to an external force applied to the shield case during picking up. Generally, as shown in a part FIG. 17A, a load is applied to the electronic component 1 from the upper surface of a shield case 2 by a jig used for characteristic screening of an electronic component 1, and a terminal electrode 4 provided on the back surface of a board body 3 of the electronic component 1 electrically comes into contact with a measurement terminal P of a measurement instrument as shown in FIG. 17B. At this time, if the shield case is markedly deformed, then the upper surface of the shield case 2 bends due to the load, and the shield case 2 comes into contact with an element component 5, such as a chip component. This may cause a short-circuit. In addition, since the distance between the shield case 2 and the element component 5 varies, the characteristic value of the element component 5 is changed. Accordingly, it is difficult to accurately measure the characteristic value of the electronic component 1. In some cases, an acceptable product may be erroneously identified as a defective product and removed, or a defective product may be erroneously identified as an acceptable product and shipped. To avoid this, a thin resin film may be provided on the inner surface of the shield case 2 as an insulating layer. However, the provision of the resin film increases the manufacturing cost. In addition, the reliability of the electronic component may be deteriorated if the resin film becomes detached.

With the configuration disclosed in Patent Document 2, since the ceramic cover member has the box-like shape, if the thickness of the ceramic cover member is reduced so as to reduce the height of the electronic component, waviness may be generated at a top portion 2A because of the difference between the behavior of shrinkage in a plane direction of the top portion 2A and that of an outer wall 2B of the box-like cover member 2 during firing, as shown in FIGS. 18A and 18B. Due to the waviness, the thickness of the top portion 2A of the cover member 2 is not substantially reduced, and consequently, the reduction in height of the electronic component may not be sufficient. In addition, when the electronic component is mounted on the mother board, it is difficult to suck the electronic component with the cover member 2 interposed therebetween, during picking up because the top portion 2A of the cover member 2 is not flat. This may cause defective mounting. FIG. 18A is a partial cross-sectional view when a plurality of cover members are manufactured at a time, and FIG. 18B is a cross-sectional view when the cover members are cut into individual pieces.

With the configuration disclosed in Patent Document 3, the cavity of the electronic component is sealed with the flat cover member. Thus, the configuration may not be applied to an electronic component having no cavity. Accordingly, with this configuration, a cavity is required on the side of the wiring board on which the cover member is disposed. This may increase the number of steps in the manufacturing procedure, thereby increasing the manufacturing cost. Further, when the chip component is mounted on the cover member, soldering and reflowing must be performed two times for mounting the chip component on the cover member, and for mounting the cover member on the wiring board. When the cover member is mounted on the wiring board, however, the chip component previously mounted on the cover member may be detached due to remelting of the solder. Accordingly, breaking may occur, and in some cases, the solder may become an alloy or be brittle due to recrystallization of the solder. Thus, the reliability of the solder connection portion may be seriously deteriorated.

SUMMARY OF THE INVENTION

To overcome the problems described above, preferred embodiments of the present invention provide an electronic component and a manufacturing method thereof, the electronic component having a cover member that can be highly accurately fabricated with a reduced thickness, highly accurately mounted on a wiring board, and that enables a reduction in height of the electronic component.

An electronic component according to a preferred embodiment of the present invention includes a wiring board having a wiring pattern, surface mount devices mounted on a main surface of the wiring board, and a cover member arranged to cover the surface mount devices, in which the cover member includes a top portion made of a flat ceramic member, and a leg portion made of a columnar member having a height equal to or greater than the heights of the surface mount devices.

The columnar member may be a columnar metal that is integrally formed with the flat ceramic member by co-firing.

The top portion may have a multilayered structure in which a plurality of ceramic layers are laminated, a shield electrode layer is disposed at an interlayer and/or on an outer surface of the multilayered structure, and the shield electrode layer is connected to the columnar metal with a via conductor provided at the ceramic layers interposed therebetween.

The shield electrode layer and the columnar metal may be integrally formed by co-firing.

An opening may be provided at a portion of the shield electrode layer that faces at least one of the surface mount devices.

In the electronic component according to this preferred embodiment, the top portion may have a multilayered structure in which a plurality of ceramic layers are laminated, a thick-film resistor is disposed at an interlayer and/or on an outer surface of the multilayered structure, and the thick-film resistor is connected to the columnar metal with a via conductor provided at the ceramic layers interposed therebetween.

The top portion may have a shield electrode layer provided at an interlayer and/or on an outer surface of the top portion, and an opening is provided at a portion of the shield electrode layer facing the thick-film resistor.

Alternatively, the top portion may have a chip ceramic electronic component having a ceramic sintered body as an element body thereof and a terminal electrode, and at least a portion of the chip ceramic electronic component is embedded in the top portion.

The wiring board may be provided as a ceramic multilayered board in which a plurality of first low temperature co-fired ceramic layers are laminated, and a wiring pattern primarily including a material selected from silver and copper is provided at an interlayer of the ceramic multilayered board.

The top portion may have a laminated structure in which a plurality of second low temperature co-fired ceramic layers are laminated, and the second low temperature co-fired ceramic layers and the first low temperature co-fired ceramic layers have substantially the same material composition.

A method of manufacturing an electronic component according to another preferred embodiment of the present invention includes a step of fabricating a wiring board having a wiring pattern, a step of fabricating a cover member including a flat top portion, and a leg portion made of a columnar member integrally formed with the top portion and extending substantially perpendicularly from the top portion, and a step of superposing the cover member on a main surface of the wiring board, and connecting the cover member to the wiring board with the leg portion interposed therebetween.

The top portion may have a multilayered structure in which a plurality of ceramic layers are laminated, a shield electrode layer is disposed at an interlayer and/or on an outer surface of the multilayered structure, and the columnar member is a columnar metal integrally formed with the shield electrode layer by co-firing.

The step of fabricating the cover member may include a step of fabricating a top ceramic unfired body primarily including low temperature co-fired ceramic, and having an unfired shield electrode layer at an interlayer and/or on an outer surface of the top ceramic unfired body, a step of fabricating a shrinkage-suppression ceramic unfired body primarily including sintering resistant ceramic that is not substantially sintered at a firing temperature of the low temperature co-fired ceramic, and having an unfired columnar member to be the columnar member, a step of superposing the shrinkage-suppression ceramic unfired body on one of main surfaces of the top ceramic unfired body, a step of co-firing the top ceramic unfired body and the shrinkage-suppression ceramic unfired body at the firing temperature of the low temperature co-fired ceramic so as to sinter the top ceramic unfired body and to integrate the unfired shield electrode layer and the unfired columnar member by the co-firing, and step of removing the shrinkage-suppression ceramic unfired body.

The top ceramic unfired body may have an unfired thick-film resistor at an interlayer and/or on an outer surface of the top ceramic unfired body.

An opening may be provided at a portion of the unfired shield electrode layer facing at least one of the surface mount devices.

The top ceramic unfired body may have a chip ceramic electronic component on the main surface of the top ceramic unfired body, the chip ceramic electronic component having a ceramic sintered body as an element body, and a terminal electrode.

The columnar member may be formed to have a tapered cross section.

The columnar member of the cover member may be connected to the wiring pattern provided on the surface of the wiring board with a binder interposed therebetween.

The method of manufacturing the electronic component may further include a step of connecting the wiring board and the cover member to each other as a mother stack, and dividing the mother stack into individual electronic components.

The columnar member may be divided when the mother stack is divided, so as to provide an electronic component having a divided surface of the columnar member as a side electrode.

With preferred embodiments of the present invention, an electronic component and a manufacturing method thereof can be provided, the electronic component having a cover member that can be highly accurately fabricated with a reduced thickness, highly accurately mounted on a wiring board, and that can enable a reduction in height of the electronic component.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 14A to 14D are cross-sectional views each showing a primary portion of an electronic component according to a yet further preferred embodiment of the present invention.

DETAILED DESCRIPTION OF PREFERRED EMBODIMENTS

Preferred embodiments of the present invention are described below with reference to FIGS. 1 to 16.

FIRST PREFERRED EMBODIMENT

Figure 1A:
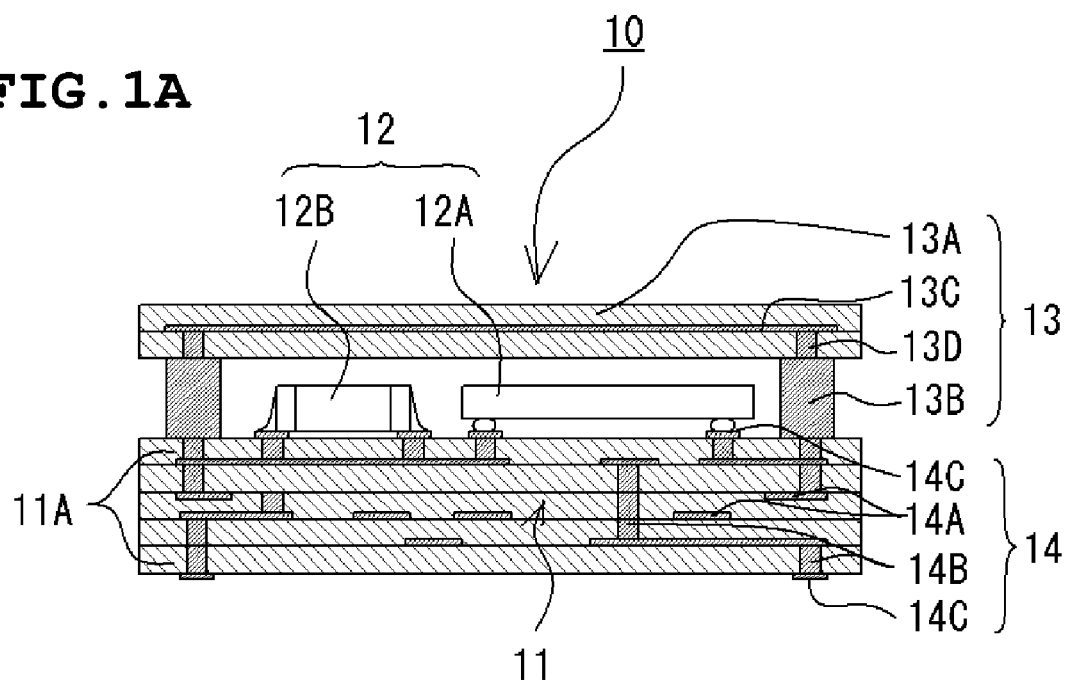
FIGS. 1A and 1B shown an electronic component according to a preferred embodiment of the present invention, FIG. 1A being a cross-sectional view of the entire electronic component, and FIG. 1B being a perspective view of a cover member of the electronic component.

As shown in FIG. 1A, for instance, an electronic component 10 of the present preferred embodiment preferably includes a wiring board 11 having a predetermined wiring pattern, a plurality of surface mount devices 12 mounted on a main surface (an upper surface) of the wiring board, and a cover member 13 arranged to cover the surface mount devices 12. For example, the electronic component 10 is mounted on a mount board, such as a mother board (not shown).

As shown in FIG. 1A, the wiring board 11 is, for example, a ceramic multilayered board in which a plurality of ceramic layers 11A are laminated. A wiring pattern 14 includes an in-plane conductor 14A having a predetermined pattern and arranged at an interface between vertically arranged ceramic layers 11A and 11A, a via conductor 14B having a predetermined pattern and penetrating through the ceramic layers 11A so as to electrically connect the vertically arranged in-plane conductors 14A and 14A, and surface electrodes (terminal electrodes) 14C and 14C having a predetermined pattern and arranged on both upper and lower surfaces of the wiring board 11.

For example, as shown in FIG. 1A, a chip-like active electronic component 12A, such as a silicon semiconductor device, and a gallium arsenide semiconductor device, and a chip-like passive electronic component 12B, such as a capacitor, an inductor, and a resistor, are mounted as the surface mount devices 12. The surface mount devices 12A and 12B are electrically connected to the surface electrode 14C on the upper surface of the wiring board 11, namely, to the wiring pattern 14 to establish a continuity, for instance, through solder, conductive resin, or a bonding wire made of Au, Al, Cu, or the like, as shown in FIGS. 1A and 1B.

Figure 1B:
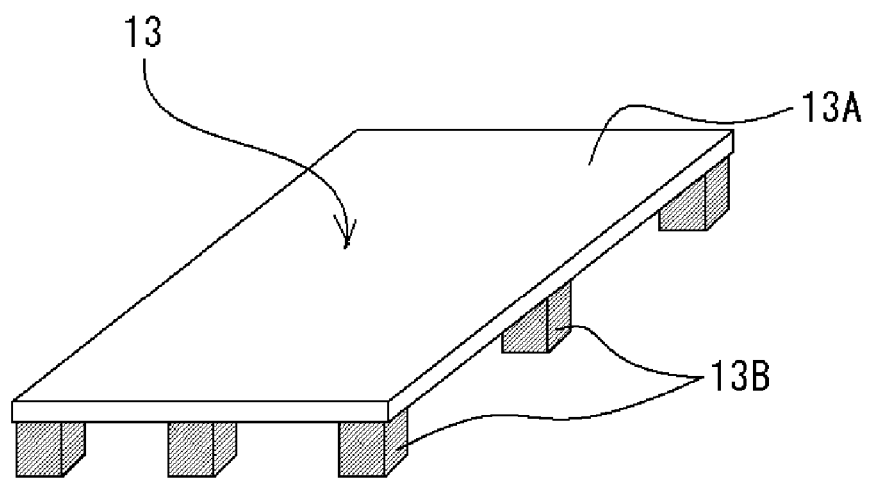

As shown in FIGS. 1A and 1B, the cover member 13 includes a top portion 13A made of a flat ceramic member, and a plurality of leg portions 13B made of columnar members extending substantially perpendicularly downward from the peripheral edge of the lower surface of the top portion 13A. The top portion 13A has a laminated structure in which a plurality of ceramic layers are laminated. The leg portions 13B are made of, for example, columnar metals to have a height greater than the heights of the surface mount devices 12 from the upper surface of the wiring board 11. Also, the leg portions 13B are integrally formed with the top portion 13A by co-firing. A shield electrode layer 13C is arranged in the top portion 13A in a plane direction. Via conductors 13D are provided to connect the peripheral edge of the shield electrode layer 13C and the leg portions 13B. The leg portions 13B, the shield electrode layer 13C and the via conductors 13D are preferably made of the same conducive metal material. The shield electrode layer 13C arranged in the top portion 13A is connected to the wiring pattern 14 of the wiring board 11 through the via conductors 13D and the leg portions 13B, so as to protect the surface mount devices 12 from the external magnetic field environment. The shield electrode layer 13C is preferably grounded to a ground electrode provided at the wiring board 11 through the columnar metal leg portions 13B. The shield electrode layer 13C, however, may not be grounded.

The ceramic layers 11A and the ceramic layers of the top portion 13A of the cover member 13 are made of ceramic materials. Both ceramic layers are preferably made of the same ceramic material. For example, the ceramic material may be a low temperature co-fired ceramic (LTCC) material. The LTCC material can be sintered at a temperature of about 1050° C. or less, and thus, is a ceramic material that can be co-fired with Ag, Cu, or other similar material, having a small resistivity. In particular, the LTCC material may be a glass composite LTCC material in which borosilicate glass is mixed with ceramic powder made of alumina, zirconia, magnesia, or forsterite, a crystallized glass LTCC material including ZnO—MgO—$Al_2O_3$—$SiO_2$ crystallized glass, or a non-glass LTCC material using BaO—$Al_2O_3$—$SiO_2$ ceramic powder, $Al_2O_3$—CaO—$SiO_2$—MgO—$B_2O_3$ ceramic powder, or other suitable LTCC material.

The shield electrode layer 13C, the via conductors 13D, and the leg portions 13B of the cover member 13, and the wiring pattern 14 of the wiring board 11, are made of the above-described conductive metal materials. The conductive metal material may be metal primarily including at least one selected from Ag, an Ag—Pt alloy, an Ag—Pd alloy, Cu, Ni, Pt, Pd, W, Mo, and Au. In the examples of the conductive metal materials, Ag, an Ag—Pt alloy, an Ag—Pd alloy and Cu may be preferably used as a wiring material because these materials each have a small resistivity. When the LTCC material is used as the ceramic material for forming the ceramic layers 11A and the ceramic layers of the top portion 13A, a metal material having a low resistance and a low melting point of about 1050° C. or less, such as Ag or Cu, is used as the conductive metal material. Such a metal material can be co-fired with the LTCC material at a low temperature of about 1050° C. or less.

In this preferred embodiment, the ceramic material and the conductive metal material of the wiring pattern used for the wiring board 11 may be substantially the same as those used for the cover member 13. If the materials of the wiring board 11 are different from those of the cover member 13, the cover member 13 may be detached from the wiring board 11 due to the difference between the coefficient of thermal expansion of the materials for the wiring board 11 and that of the cover member 13, in accordance with variation in temperature.

Next, a preferred embodiment of a manufacturing method of the electronic component of the present invention is described with reference to FIGS. 2A to 4C. In this preferred embodiment, a non-shrinkage method is used to fabricate the wiring board 11 and the cover member 13. The non-shrinkage method is a method causing substantially no difference between the dimension in a plane direction of the ceramic board before firing of the ceramic board, and the dimension thereof after firing. In the non-shrinkage method, a shrinkage-suppression sheet (described below) is used. Though described below, the manufacturing method of the electronic component of this preferred embodiment includes a step of fabricating the wiring board 11 having the wiring pattern 14, a step of fabricating the cover member 13 having the top portion 13A made of the flat ceramic member and the leg portions 13B made of columnar members integrally formed with the top portion 13A and extending substantially perpendicularly downward from the top portion 13A, and a step of superposing the cover member 13 on the upper surface of the wiring board 11 and connecting the cover member 13 to the wiring board 11 with the leg portions 13B interposed therebetween.

1. Fabrication of Wiring Board (1) Fabrication of Board Ceramic Unfired Body (Board Ceramic Green Sheet)

First, mixed powder in which borosilicate glass is mixed with alumina powder, as an example of LTCC powder, is prepared. The mixed powder is dispersed in an organic vehicle, and thus, a slurry is prepared. The slurry is molded in a sheet form by a casting method. In this manner, a predetermined number of board ceramic green sheets 111A each having, for example, a thickness of about 20 μm are fabricated as shown in a FIG. 2A. The ceramic green sheets 111A are processed by steps of laminating, pressing, and firing (described below), and the thickness of each ceramic green sheet 111A becomes about 10 μm after firing. A via hole in a predetermined pattern is formed on the board ceramic green sheet 111A, e.g., by using laser beam or a die, and then the via hole is filled with conductive paste so as to provide an unfired via conductor 114B.

For example, the conductive paste primarily includes Ag. The same conductive paste is printed on the board ceramic green sheet 111A in a predetermined pattern, e.g., by screen printing to provide an unfired in-plane conductor 114A. Similarly, the ceramic green sheets 111A that have the unfired in-plane conductors 114A, the unfired via conductors 114B, and unfired surface electrodes 114C, respectively, formed in predetermined patterns, are fabricated. For example, five ceramic green sheets 111A are prepared.

(2) Fabrication of Shrinkage-Suppression Ceramic Unfired Body (Shrinkage-Suppression Ceramic Green Sheet)

Figure 2A:
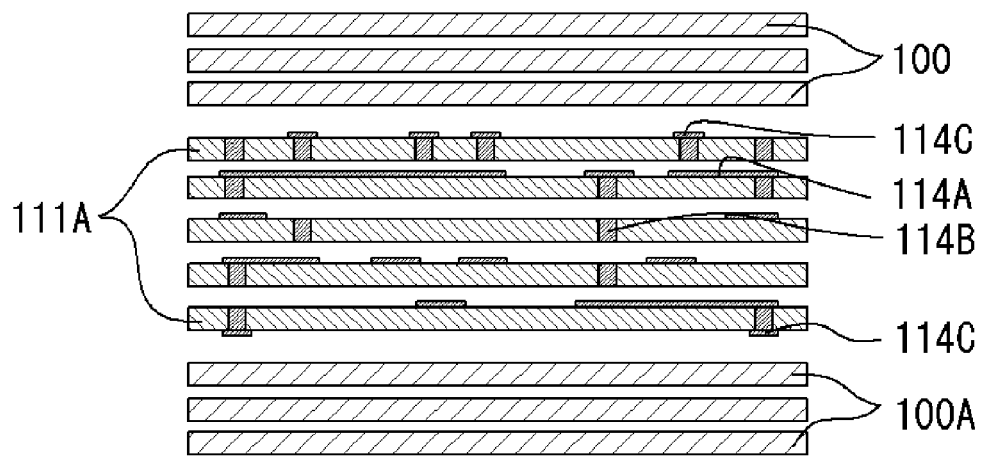
FIGS. 2A to 2C are process drawings showing primary steps in a fabricating procedure of a wiring board of the electronic component shown in FIG. 1.

A shrinkage-suppression ceramic green sheet primarily includes sintering resistant ceramic powder that is not sintered at a firing temperature of the LTCC material. For example, alumina powder is prepared as the sintering resistant ceramic powder, the alumina powder is dispersed in an organic vehicle, and thus, a slurry is prepared. The slurry is molded in a sheet form by a casting method. A predetermined number of shrinkage-suppression ceramic green sheets 100 and 100A are fabricated as shown in FIG. 2A. The sintering temperature of the shrinkage-suppression ceramic green sheets 100 and 100A is in the range of about 1500° C. to about 1600° C., which is markedly higher than the sintering temperature (about 1050° C.) of the board ceramic green sheet 111A made of the LTCC powder. Due to this, the shrinkage-suppression ceramic green sheets 100 and 100A are not substantially sintered at the firing temperature of the board ceramic green sheet 11A. For example, three shrinkage-suppression ceramic green sheets 100 and three shrinkage-suppression ceramic green sheets 100A are fabricated as shown in FIG. 2A. Each shrinkage-suppression ceramic green sheet 100 is substantially equivalent to each shrinkage-suppression ceramic green sheet 100A. The sintering resistant ceramic powder may be, for example, ceramic powder made of zirconia, magnesia, or other suitable material, instead of alumina. The shrinkage-suppression ceramic green sheets 100 and 100A may include a ceramic component equivalent to that included in the board ceramic green sheet 11A.

(3) Fabrication of Composite Laminated Body

Figure 2B:
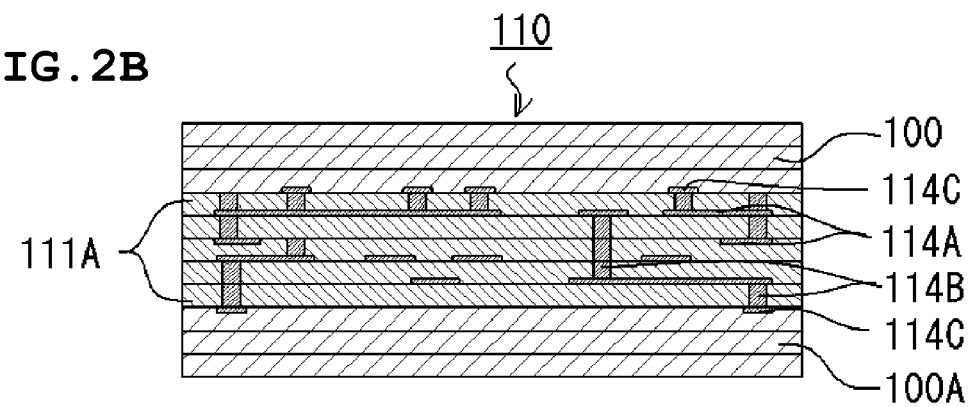

As shown in FIG. 2B, the three shrinkage-suppression ceramic green sheets 100A are laminated. The board ceramic green sheet 111A having the unfired via conductor 114B and the unfired surface electrode 114C is superposed thereon with the unfired surface electrode 114C arranged in the downward direction. The three board ceramic green sheets 111A having the unfired in-plane conductors 114A and the unfired via conductors 114B are superposed thereon. The board ceramic green sheet 111A having the unfired via conductor 114B and the unfired surface electrode 114C is superposed thereon with the unfired surface electrode 114C arranged in the upward direction. Then, after the three shrinkage-suppression ceramic green sheets 100 are superposed, the layers are pressed with a pressure in the range of about 0.2 MPa to about 1.5 MPa in a lamination direction (a vertical direction) so as to be integrated. Accordingly, a composite laminated body 110 shown in FIG. 2B is provided.

(4) Firing of Composite Laminated Body

Figure 2C:
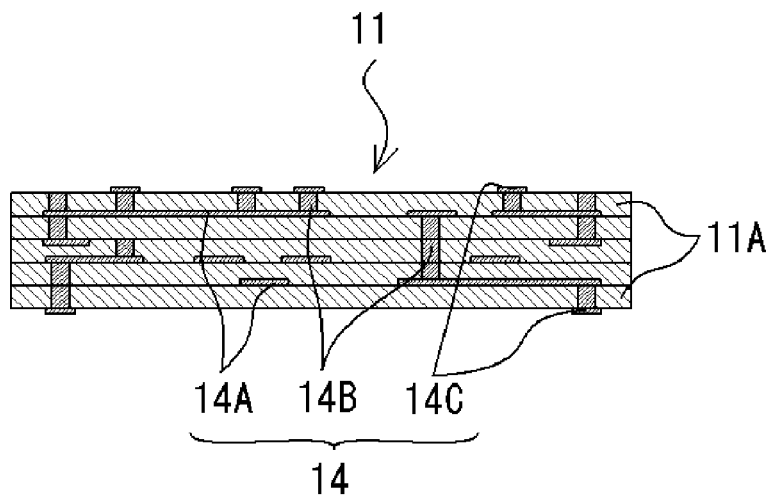

When the composite laminated body 110 is fired at a predetermined temperature, for example, about 1050° C. or less (e.g., about 870° C.), the shrinkage-suppression ceramic green sheets 100 and 100A are not substantially sintered, and thus, not substantially shrunk in the plane direction. Therefore, even when the five board ceramic green sheets 111A are sintered and integrated, the board ceramic green sheets 111A are not substantially shrunk in the plane direction because of the function of the shrinkage-suppression ceramic green sheets 100 and 100A, but the board ceramic green sheets 111A are shrunk substantially in the lamination direction (the thickness direction), thereby providing the highly accurate wiring board 11 having the wiring pattern 14 as shown in FIG. 2C. Since the wiring board 11 is shrunk substantially only in the thickness direction, the wiring board 11 enables a reduction in height of the electronic component 10. By firing, the organic vehicle is eliminated by fire, and the shrinkage-suppression ceramic green sheets 100 and 100A become an aggregation of alumina powder. The aggregation of alumina powder may be easily removed by blasting or other suitable method. By removing the alumina powder, the wiring board 11 is easily obtained. For example, the total thickness of the five board ceramic green sheets 111A each having the thickness of about 20 μm becomes about 100 μm. By firing, the five board ceramic green sheets 111A are shrunk in the height direction, and the wiring board 11 having the thickness of about 50 μm is obtained.

(5) Plating

After the wiring board 11 is fabricated, the surface electrodes 14C are plated, for example, by gold plating, so as to enhance wettability thereof with respect to a binder member such as solder.

2. Fabrication of Cover Member (1) Fabrication of Top Ceramic Unfired Body (Top Ceramic Green Sheet)

Figure 3A:
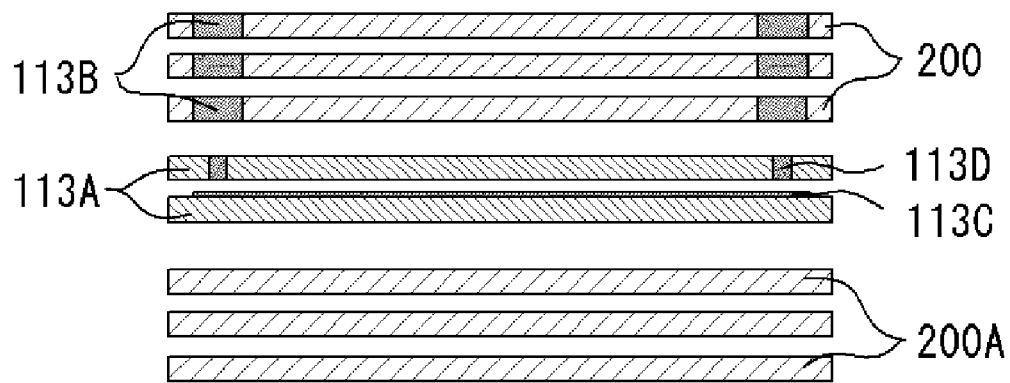
FIGS. 3A to 3C are process drawings showing primary steps in the fabricating procedure of the cover member of the electronic component shown in FIG. 1.

The cover member 12 is fabricated by using a material similar to the wiring board 11, in a manner similar to the wiring board 11. First, a predetermined number (e.g., two) of top ceramic green sheets 113A are fabricated as shown in FIG. 3A. The top ceramic green sheets 113A each have the thickness of about 20 μm. An unfired shield electrode layer 113C having a wide area is formed on the upper surface of one of the top ceramic green sheets 113A by wide area printing with conductive paste. A plurality of via holes are formed in a predetermined pattern at the top ceramic green sheets 113A. The via holes are filled with the conductive paste so as to provide a plurality of unfired via conductors 113D. When the top ceramic green sheets 113A are laminated, the plurality of unfired via conductors 113D are located at the peripheral edge of the unfired shield electrode layer 113C.

(2) Fabrication of Shrinkage-Suppression Ceramic Green Sheet

Figure 3B:
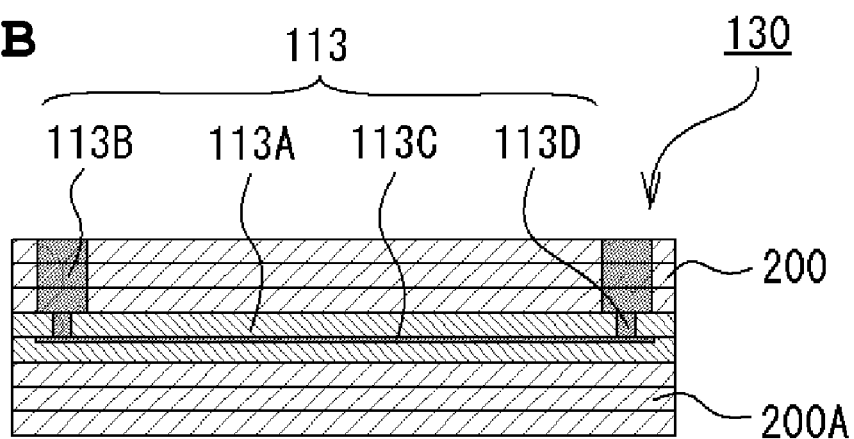
Figure 3C:
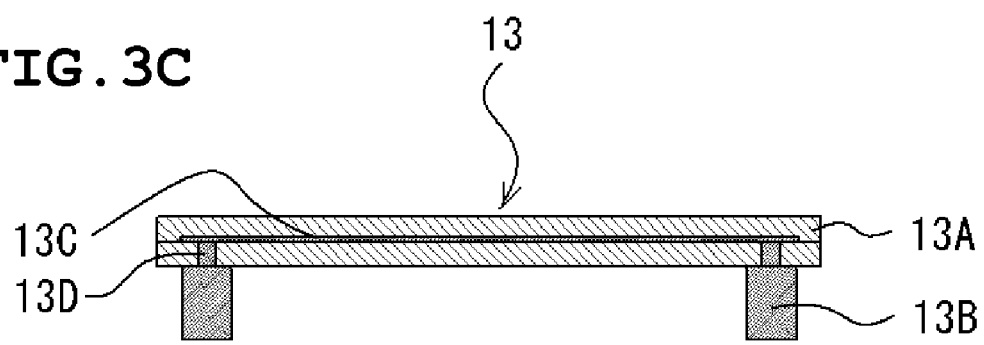

Similar to the wiring board 11, a predetermined number (e.g., six) of shrinkage-suppression ceramic green sheets are fabricated. Via holes for leg portions are formed in a predetermined pattern at three shrinkage-suppression ceramic green sheets 200 by using laser beam or a die. Then, the via holes are filled with the conductive paste so as to provide unfired leg portions 113B. The unfired leg portions 113B must have a height equal to or greater than the mounting heights of the surface mount devices 12 after firing. The height of the unfired leg portions 113B is controlled by adjusting the number of shrinkage-suppression ceramic green sheets 200 to be used. The lateral cross section of each unfired leg portion 113B after firing may be a substantially circular shape or a substantially polygonal shape. The diameter (in the case of the substantially polygonal shape, the maximum dimension passing through the center thereof) of the circular shape may range from about 0.1 mm to about 1 mm. In this preferred embodiment, for example, three shrinkage-suppression ceramic green sheets 200 are fabricated as shown in FIGS. 3A and 3B. Also, three shrinkage-suppression ceramic green sheets 200A having no unfired leg portion 113B are fabricated as shown in FIGS. 3A and 3B. If an electric continuity is not required to be established, the via holes for the columnar members may be filled with ceramic paste (primarily including the LTCC) to provide leg portions. In such a case, the columnar members made of the ceramic paste are integrally formed with the wiring board by co-firing.

(3) Fabrication of Composite Laminated Body

As shown in FIG. 3A, the three shrinkage-suppression ceramic green sheets 200A having no unfired leg portion are laminated. The top ceramic green sheet 113A having the unfired shield electrode layer 113C is superposed thereon with the unfired shield electrode layer 113C arranged in the upward direction. The top ceramic green sheet 113A having the unfired via conductors 113D is superposed thereon. Then, the three shrinkage-suppression ceramic green sheets 200 having the unfired leg portions 113B are superposed thereon. At this time, the unfired leg portions 113B of the shrinkage-suppression ceramic green sheets 200 are aligned with the unfired via conductors 113D of the top ceramic green sheet 113A. The shrinkage-suppression ceramic green sheets 200 are pressed with a predetermined pressure (e.g., a pressure in the range of about 0.2 MPa to about 1.5 MPa) to fabricate a composite laminated body 130 as shown in FIG. 3B. Then, the composite laminated body 130 is fired at a predetermined temperature (e.g., about 870° C.) to fabricate the cover member 13 shown in FIG. 3C.

While the shield electrode layer 13C is provided as an inner layer in the top portion 13A in this preferred embodiment, the shield electrode layer 13C may be provided on the outer surface of the top portion 13A. However, the shield electrode layer 13C should not be provided on the inner surface of the top portion 13A (the inner surface of the cover member 13). If the shield electrode layer 13C is provided on the inner surface of the cover member 13, the top portion 13A may bend inward due to a pressure force of a jig during characteristic screening, etc., resulting in that the top portion 13A comes into contact with the surface mount device 12 mounted on the wiring board 11. Due to this, accurate characteristic screening cannot be performed. If the shield electrode layer 13C is provided at the inner layer of the cover member 13 or on the outer surface thereof, accurate characteristic screening can be performed.

3. Mounting of Surface Mount Device and Cover Member to Wiring Board

Figure 4A:
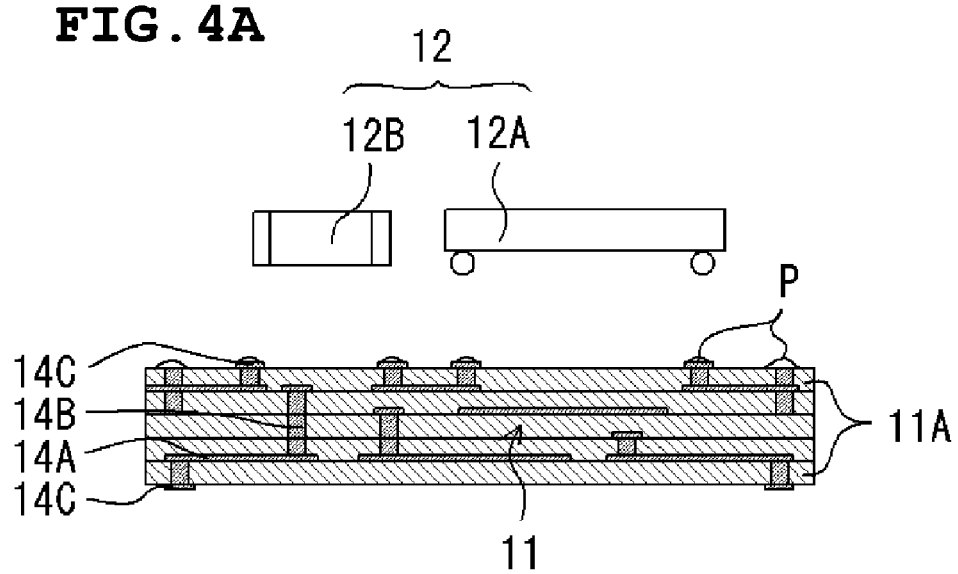
FIGS. 4A to 4C are process drawings showing an assembly procedure of the electronic component shown in FIG. 1.
Figure 4B:
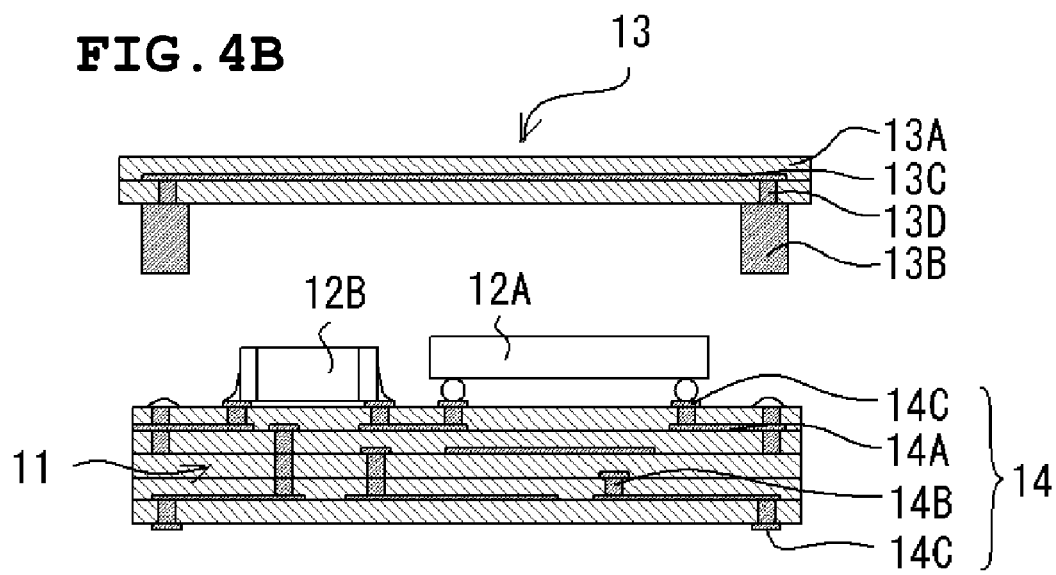
Figure 4C:
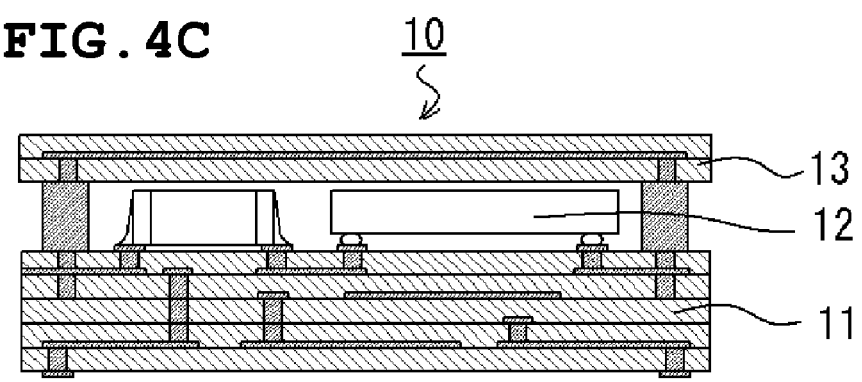

As shown in FIG. 4A, the surface mount devices 12 are mounted on the wiring board 11 with the surface of the wiring board 11 to be mounted facing the upper side. A binder P such as solder paste is applied to the surface electrode 14C for the surface mount devices, and the via conductors 14B to which the leg portions of the cover member 13 are connected, e.g., by using a metal mask. Then, as shown in FIG. 4A, the surface mount devices 12 are mounted and arranged on the wiring board 11 by using a mounter (not shown). As shown in FIG. 4B, the cover member 13 is mounted and arranged on the wiring board 11 by using the mounter. The wiring board 11 is processed with heat by reflowing or other suitable method, so that the solder is melted, and the surface mount devices 12 and the cover member 13 are mounted on the wiring board 11 as shown in FIG. 4C. Since the mounting surface is flat when the mounting is performed by using a metal mask, the metal mask can be accurately adhered on the mounting surface.

Figure 5:
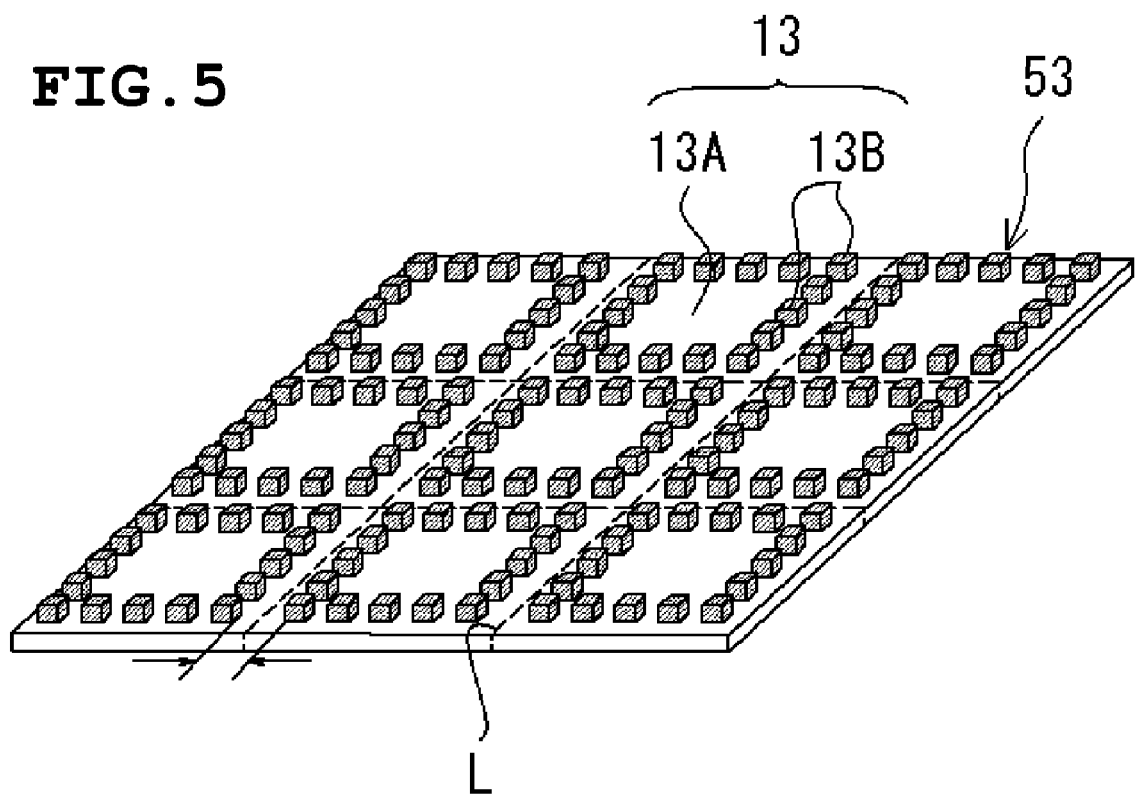
FIG. 5 is a perspective view showing a mother stack of the cover members shown in FIG. 1B.
Figure 6:
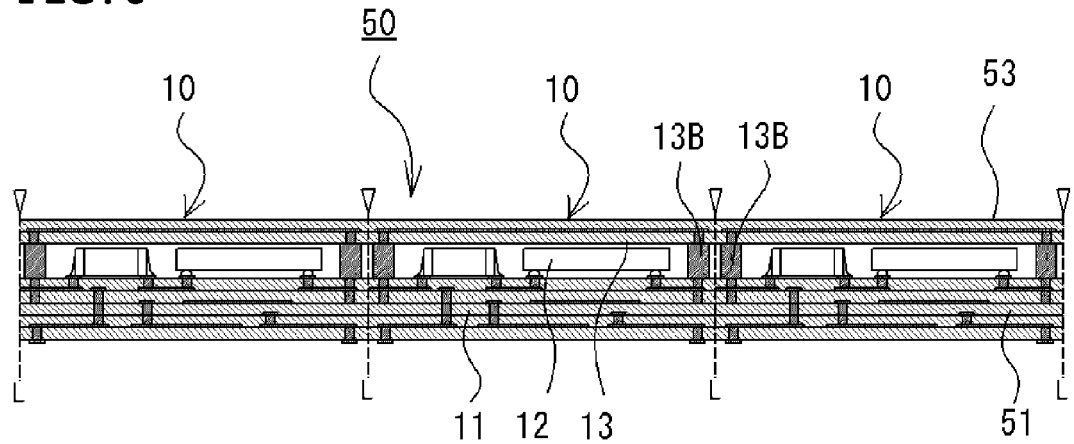
FIG. 6 is a cross-sectional view showing a group of the electronic components assembled by using the mother stack shown in FIG. 5.

In the above description, the single electronic component 10 is fabricated. In view of industrial production, a plurality of electronic components 10 are fabricated at one time as a mother stack as shown in FIGS. 5 and 6. The plurality of electronic components 10 can be fabricated at one time in a manner similar to the fabrication procedure mentioned above, except that a plurality of wiring boards and cover members are obtained. In particular, in the same manner as the procedure for fabricating the single electronic component 10, a first mother stack 51 (see FIG. 6) in which a plurality of wiring boards are arranged in a matrix form is fabricated, and a second mother stack 53 (see FIGS. 5 and 6) in which a plurality of cover members 13 are arranged in a matrix form is fabricated. The second mother stack 53 has division lines L to be divided into the individual cover members 13. The leg portions 13B of the cover members 13 are preferably have a substantially rectangular frame form provided on both sides of the expected division lines L. The surface mount devices 12 are mounted on the respective wiring boards 11 of the first mother stack 51, the second mother stack 53 is mounted thereon, and then the mounted components are integrated by heating, so as to fabricate an electronic component group 50 shown in FIG. 6. The electronic component group 50 is diced along the division lines L of the electronic component group 50, thereby obtaining the individual electronic components 10.

Figure 7:
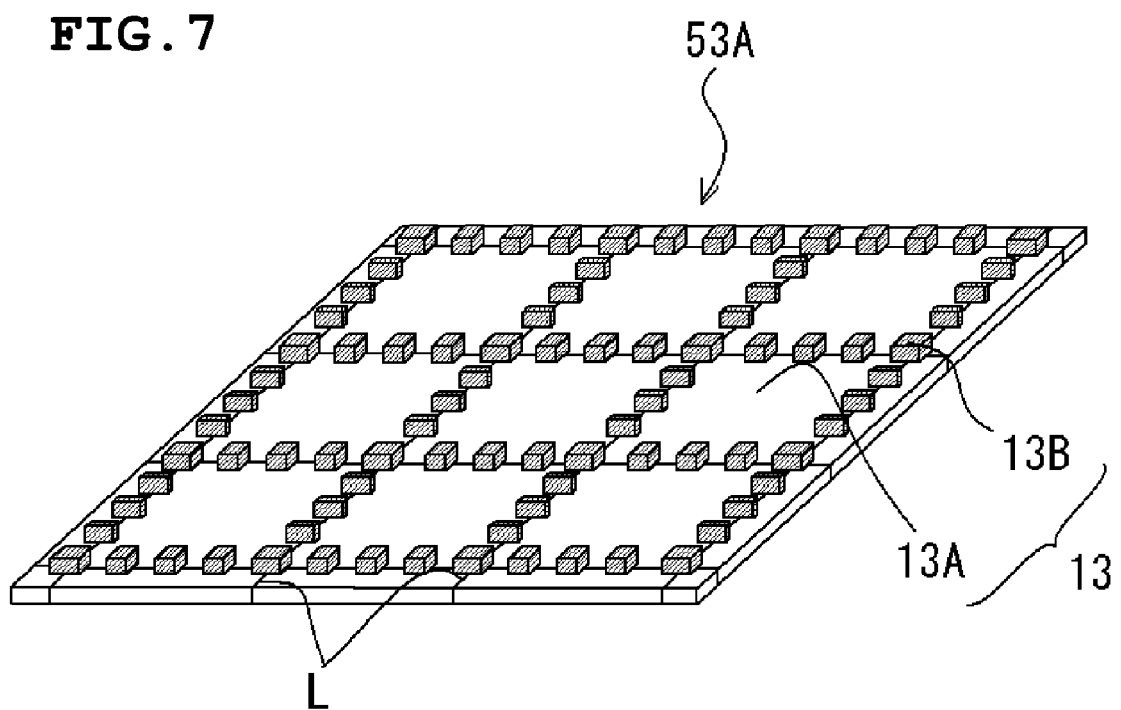
FIG. 7 is a perspective view showing a mother stack of cover members used for an electronic component according to another preferred embodiment of the present invention.
Figure 8:
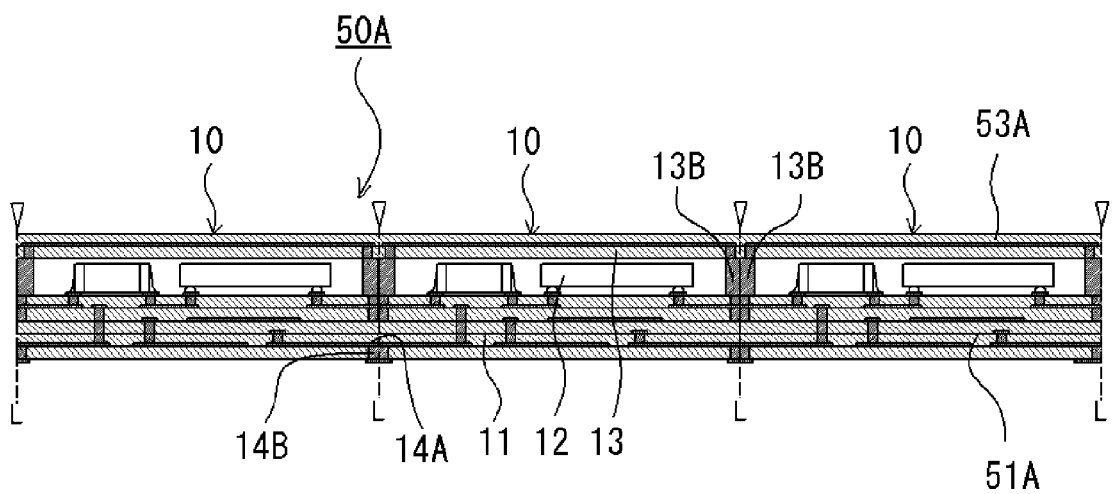
FIG. 8 is a cross-sectional view showing a group of the electronic components assembled by using the mother stack shown in FIG. 7.

Alternatively, the first and second mother stacks may be formed as shown in FIG. 7. In particular, in a second mother stack 53A shown in FIG. 7, portions corresponding to the leg portions 13B of the cover members 13 preferably have a substantially rectangular shape on division lines L of a second mother stack 53A. In addition, the via conductors 14B respectively corresponding to the leg portions 13B are provided corresponding to division lines L of a first mother stack 51A as shown in FIG. 8. The surface mount devices are mounted on respective wiring boards of the first mother stack 51A, the second mother stack 53A is mounted thereon, and then the mounted components are integrated, so as to fabricate an electronic component group 50A shown in FIG. 8 by using a mounter. When the electronic component group 50 is diced along the division lines L of the electronic component group 50A, portions corresponding to the leg portions 13B and portions corresponding to the via conductors 14B are divided at the division lines L, thereby obtaining the individual electronic components 10. In such a case, the leg portions 13B of each cover member 13, and some of the in-plane conductors 14A and some of the via conductors 14B of each wiring board 11 are arranged at the end surfaces of the electronic component 10. Accordingly, these components may be used as side electrodes when the electronic component 10 is mounted.

With the preferred embodiment described above, the cover member 13 covering the surface mount devices 12 of the wiring board 11 includes the top portion 13A made of the flat ceramic member, and the leg portions 13B made of the columnar members having the height equal to or greater than the heights of the surface mount devices. The top portion 13A is made of the flat ceramic member. Accordingly, the thickness of the cover member 13 is not varied unlike the related art, and thus, the cover member 13 is shrunk and sintered uniformly in the thickness direction during firing. Thus, the flat top portion 13A having no waviness can be provided, and this enables the reduction in height of the electronic component 10. Since the top portion 13A of the cover member 13 is the ceramic member, short-circuiting is prevented from occurring between the top portion 13A and the surface mount devices 12 even if the top portion 13A bends during the characteristic screening, etc. of the electronic component 10.

Figure 9A:
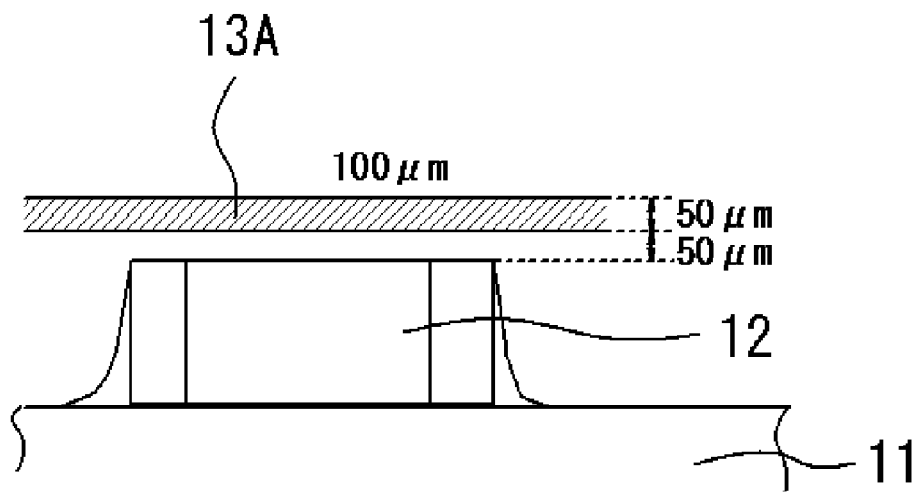
FIGS. 9A and 9B are cross-sectional views each showing a relationship between a cover member and a surface mount device of an electronic component, FIG. 9A being an illustration of the relationship between the cover member and the surface mount device of the electronic component shown in FIG. 1, and FIG. 9B being an illustration of the relationship between a metal cover member and a surface mount device of an electronic component of a related art.
Figure 9B:
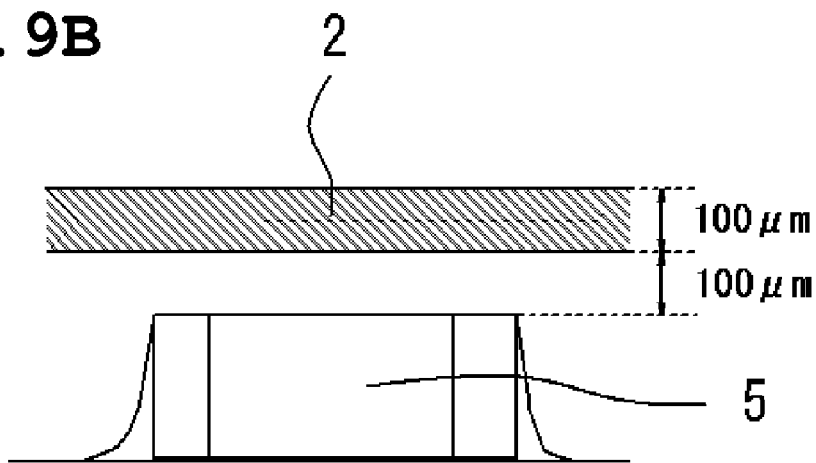

Also, since the top portion 13A is the ceramic member which does not substantially bend toward the surface mount device 12, the gap between the top portion 13A and the surface mount devices 12 can be reduced. This further enables the reduction in height of the electronic component 10. For example, as shown in FIG. 9A, when the thickness of the top portion 13A is about 50 μm, when the gap of about 50 μm corresponding to the thickness of the top portion 13A is provided with respect to the surface mount device 12, the distance from the upper surface of the surface mount device 12 to the outer surface of the top portion 13A is about 100 μm. In contrast, as shown in FIG. 9B, the thickness of a metal cover member 2 of the related art is at least about 100 μm because of the mechanical strength. When the gap of about 100 μm corresponding to the thickness of the cover member is provided, the distance from the upper surface of the surface mount device to the outer surface of the cover member is about 200 μm. Therefore, the cover member 13 of this preferred embodiment reliably achieves the reduction in height of the electronic component 10.

With this preferred embodiment, the top portion 13A has a multilayered structure in which the plurality of ceramic layers are superposed. The shield electrode layer 13C is disposed in the top portion 13A as an inner layer. The shield electrode layer 13C is connected to the leg portions 13B (the columnar metals) through the via conductors 13D provided in the ceramic layers. Accordingly, the cover member 13 connected to the wiring pattern 14, which is the ground potential of the wiring board 11, shields and protects the surface mount devices 12 provided on the wiring board 11 from the external magnetic field environment by the shield electrode layer 13C.

With this preferred embodiment, the shield electrode layer 13C and the columnar metals of the leg portions 13B are integrated by co-firing. Accordingly, no solder bump or other similar structure for connection needs to be formed on the cover member 13 when the cover member 13 is mounted. The cover member 13 can be mounted on the wiring board 11 using the mounter in the same manner as the surface mount devices 12. This facilitates the manufacturing procedure.

With this preferred embodiment, the wiring board 11 is fabricated by the non-shrinkage method using the shrinkage-suppression ceramic green sheets 100 and 100A. Accordingly, the wiring board 11 having the highly accurate wiring pattern 14 with no waviness is fabricated. In addition, since the non-shrinkage method suppresses the shrinkage in the plane direction, the wiring board 11 is substantially shrunk in the lamination direction (the thickness direction), so that the thickness of the wiring board 11 is further reduced. Thus, the reduction in height of the electronic component 10 is further enabled. Since the cover member 13 is fabricated by the non-shrinkage method using the shrinkage-suppression ceramic green sheets 200 and 200A, the top portion 13A can be reduced in thickness with no waviness generated as mentioned above, and the leg portions 13B and the top portion 13A can be integrated by co-firing. In addition, since the top portion 13A of the cover member 13 is flat, the cover member 13 can be highly accurately mounted on the wiring board 11 by using the mounter.

SECOND PREFERRED EMBODIMENT

In an electronic component of this preferred embodiment, the same numerals refer the same portions as those of the first preferred embodiment or portions corresponding to those of the first preferred embodiment. The above preferred embodiment describes the electronic component 10 in which the shield electrode layer 13C of the cover member 13 covers all surface mount devices 12. Meanwhile, the surface mount devices 12 may include a surface mount device 12, such as a type of SAW filter package, of which a characteristic is varied in accordance with the distance with respect to the shield electrode layer 13C, which is the ground potential of the cover member 13. For example, if the top portion 13A of the cover member 13 is bent by a jig or other external force during the characteristic screening of the electronic component 10, the distance between the shield electrode layer 13C of the cover member 13 and the surface mount device 12 varies, and this may affect the characteristic of the surface mount device 12.

Figure 10:
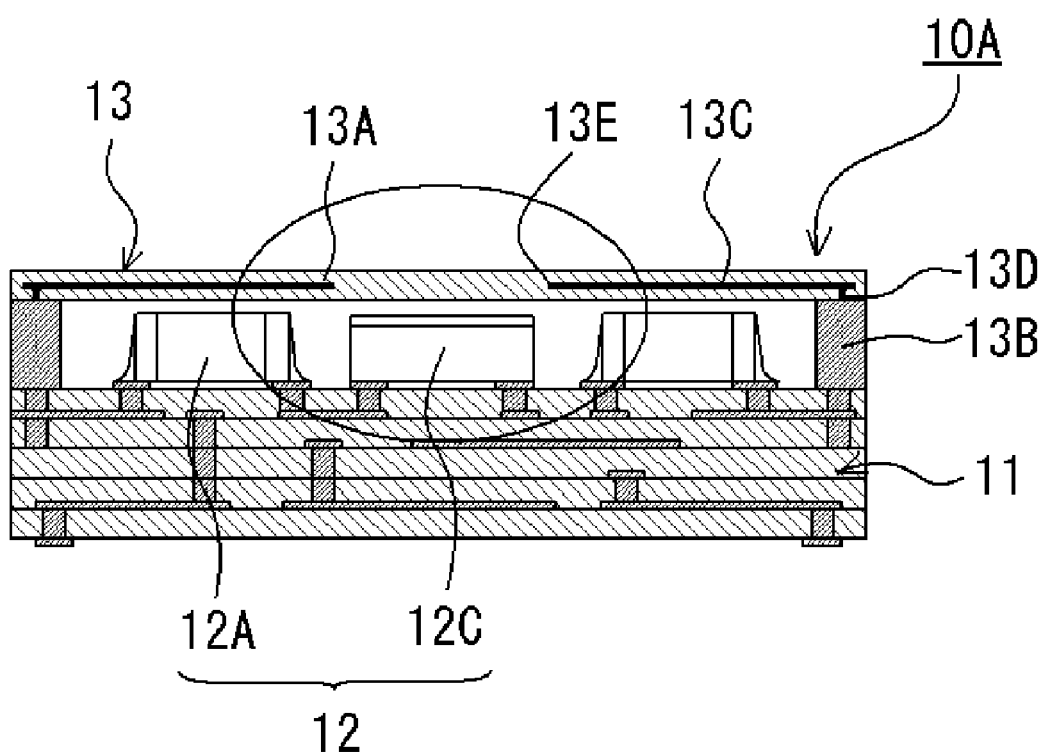
FIG. 10 is a cross-sectional view showing an electronic component according to still another preferred embodiment of the present invention.

An electronic component 10A of this preferred embodiment is similar to the electronic component 10 of the above-described preferred embodiment except that the electronic component 10A includes a predetermined surface mount device 12C circled in FIG. 10, and a cover member 13 that does not affect the characteristic of the surface mount device 12C during the characteristic screening, etc., of the surface mount device 12C. A shield electrode layer 13C of the cover member 13 has an opening 13E provided at a portion directly above the predetermined surface mount device 12C. A portion of a top portion 13A corresponding to the opening 13E is made only of the ceramic material. The cover member 13 is fabricated in a manner similar to the above-described preferred embodiment except that an unfired shield electrode layer having an opening is provided on the top ceramic green sheet by wide area printing.

With this preferred embodiment, since the portion of the top portion 13A of the cover member 13 directly above the predetermined surface mount device 12C is made of the ceramic member, the shield electrode layer 13C does not electromagnetically affect the surface mount device 12C even when the top portion 13A of the cover member 13 bends during the characteristic screening, etc., of the electronic component 10A. Accordingly, the original characteristic of the predetermined surface mount device 12C can be measured, and the quality of the electronic component 10A can be highly accurately determined. Thus, an acceptable product is prevented from being discarded, and a defective product is prevented from being shipped. Also, advantages similar to those of the above-described preferred embodiment are obtained.

THIRD PREFERRED EMBODIMENT

Figure 11A:
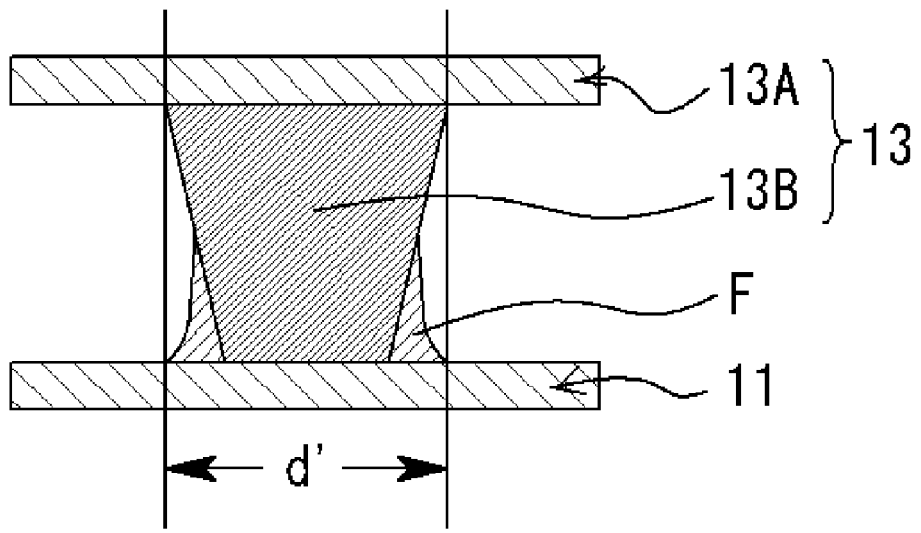
FIG. 11A and 11B are cross-sectional views showing the comparison between a leg portion of the cover member of the electronic component shown in FIG. 1 and a leg portion of a cover member of an electronic component according to yet another preferred embodiment of the present invention.

An electronic component of this preferred embodiment is similar to that of the first preferred embodiment except that a leg portion 13B of a cover member 13 has a different shape as shown in FIG. 11A. The same numerals refer the same portions as those of the first preferred embodiment or portions corresponding to those of the first preferred embodiment.

Figure 11B:
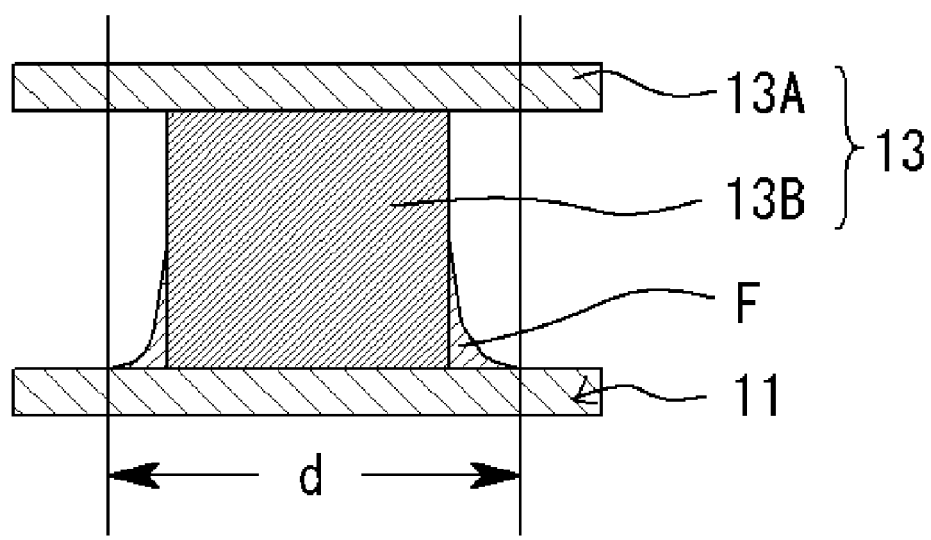

While the above preferred embodiments have the leg portion 13B of the cover member 13 preferably having a uniform diameter as shown in FIG. 11B, the leg portion 13B of this preferred embodiment has a cross section along the shaft center with a tapered shape, namely, the leg portion 13B is formed in an inverted truncated cone shape, or an inverted quadrangular pyramid shape, as shown in FIG. 11A. The leg portion 13B is formed such that a via hole is provided at the shrinkage-suppression sheet so as to have a tapered cross section, and the via hole is filled with the conductive paste. The leg portion 13B having the cross section along the shaft center with a uniform diameter according to the above preferred embodiments is formed such that a via hole with a uniform diameter is made by punching with the use of a die or other suitable device, and the via hole is filled with the conductive paste.

Accordingly, with the present preferred embodiment, the contact area between the leg portion 13B including the solder fillet F and the wiring board 11 shown in FIG. 11A, namely, a diameter d' is relatively small as compared to a diameter d having a uniform diameter as shown in FIG. 11B. In particular, the cover member 13 can be connected to the wiring board 11 while the upper end surface and the lower end surface (the contact area of the wiring board 11 to be connected to the cover member 13) of the leg portion 13B has the same contact area. Also, advantages similar to those of the above-described preferred embodiment can be obtained. Note that the leg portion 13B may include a plurality of tapered sub-legs disposed in the vertical direction.

FOURTH PREFERRED EMBODIMENT

Figure 12A:
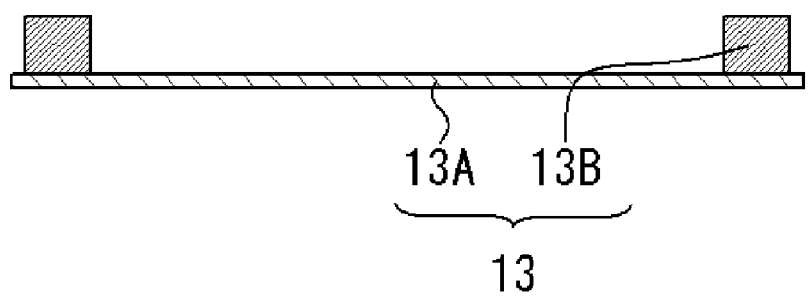
FIGS. 12A and 12B are cross-sectional views each showing a primary step of a fabricating procedure of a cover member of an electronic component according to a further preferred embodiment of the present invention.

An electronic component of this preferred embodiment is similar to that of the first preferred embodiment except that a cover member 13 has no shield electrode layer, and a continuity need no be established between the cover member 13 and the wiring board 11, as shown in FIG. 12A. In this preferred embodiment, the same numerals refer the same portions as those of the first preferred embodiment or portions corresponding to those of the first preferred embodiment.

Figure 12B:
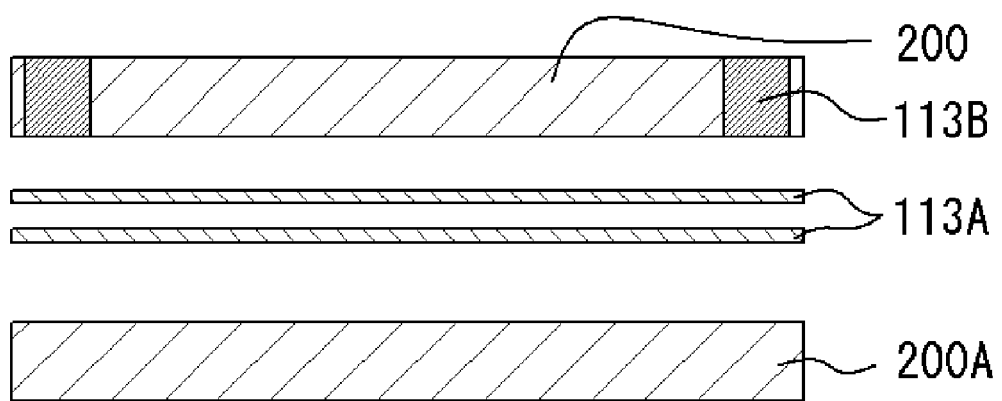

The cover member 13 of this preferred embodiment may be fabricated as shown in FIG. 12B. As shown in FIG. 12B, for example, two ceramic green sheets each having a thickness of about 20 μm are laminated as the top ceramic green sheets 113A. A shrinkage-suppression ceramic layer 200A with a thickness of about 250 μm having no unfired leg portion is disposed on the lower surface of the ceramic green sheets. A shrinkage-suppression ceramic layer 200 with a thickness of about 250 μm having unfired leg portions 113B is disposed on the upper surface of the ceramic green sheets. These layers are superposed and pressed to fabricate a composite laminated body (not shown). Then, the composite laminated body is fired, and thus, the cover member 13 including the top portion 13A and the leg portions 13B is fabricated as shown in FIG. 12A. The top portion 13A preferably has a thickness of about 20 μm. For example, the unfired leg portions 113B may use ceramic paste primarily including the LTCC. The cover member 13 may have a conductive leg portion and a non-conductive leg portion, if necessary. In such a case, a shield electrode layer is provided at the top portion 13A. With this preferred embodiment, the cover member 13 that enables the reduction in height of the electronic component can be obtained in a similar manner to the first preferred embodiment.

FIFTH PREFERRED EMBODIMENT

Figure 13A:
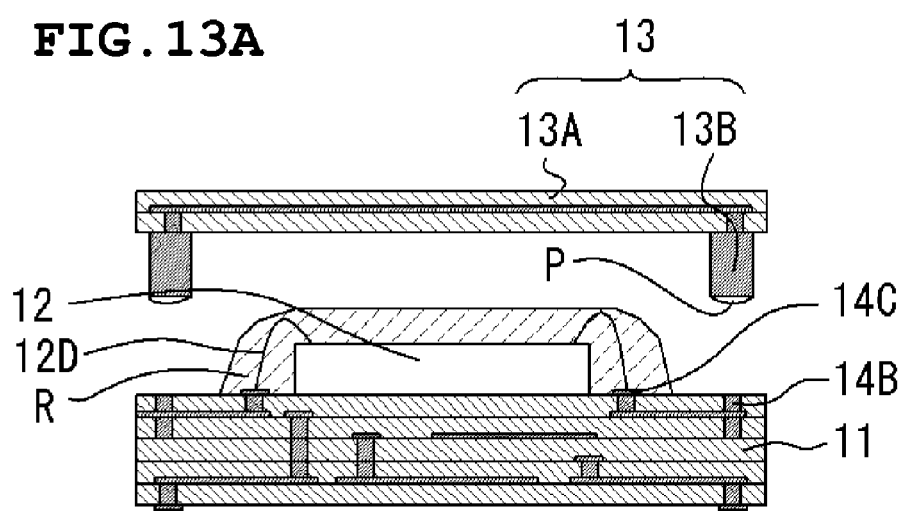
FIGS. 13A and 13B are cross-sectional views each showing an assembly procedure of an electronic component according to a still further preferred embodiment of the present invention.

An electronic component of this preferred embodiment is similar to that of the first preferred embodiment except that a surface mount device 12 sealed with resin R is provided on the wiring board 11 through a bonding wire 12D, as shown in FIG. 13A. In this preferred embodiment, the same numerals refer the same portions as those of the first preferred embodiment or portions corresponding to those of the first preferred embodiment.

With this preferred embodiment, the surface mount device 12 is mounted on the wiring board 11 while being sealed with the resin. Due to this, when the cover member 13 is mounted on the wiring board 11, solder paste may not be directly applied to the via conductors 14B by using a metal mask.

Figure 13B:
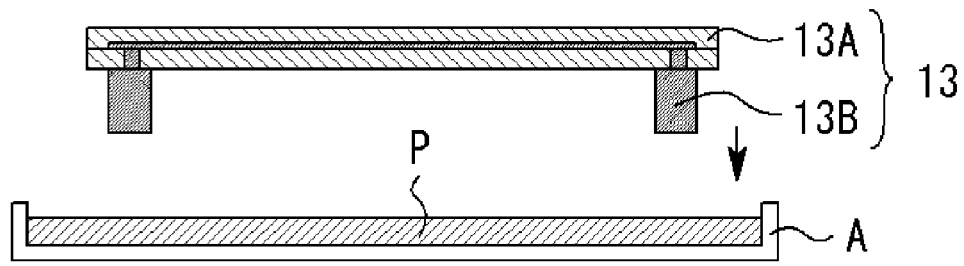

Therefore, in this preferred embodiment, a binder is applied to the tip end surfaces of the leg portions 13B of the cover member 13 as shown in FIG. 13B. The binder may be liquid or semi-liquid. Solder paste, conductive resin, or other suitable binder, may be preferably used. For example, the leg portions 13B of the cover member 13 are brought into contact with the liquid binder P in a container A, so that the binder P is directly transferred on the tip end surfaces of the leg portions 13B as shown in FIG. 13B. As shown in FIG. 13A, the position of the leg portions 13B of the cover member 13 is aligned with the position of the via conductors 14B of the wiring board 11. Then, the cover member 13 is superposed on the wiring board 11 and heated. Accordingly, the cover member 13 may be mounted on the wiring board 11.

With this preferred embodiment, even when the binder may not be applied to the via conductor 14B and the surface electrode 14C of the wiring board 11 by using the metal mask, the cover member 13 can be easily mounted on the wiring board 11 and fixed thereto by transferring the binder P on the lower tips of the leg portions 13B of the cover member 13. Also, advantages similar to those of the first preferred embodiment can be obtained.

SIXTH PREFERRED EMBODIMENT

An electronic component of this preferred embodiment is similar to that of the first preferred embodiment except that a thick-film resistor 13F and a wiring pattern 13G thereof are provided in the top portion 13A of the cover member 13 instead of the shield electrode layer 13C, as shown in FIG. 14A. The cover member 13 of this preferred embodiment may be fabricated in a manner similar to that of the first preferred embodiment. In this preferred embodiment, the same numerals refer the same portions as those of the first preferred embodiment or portions corresponding to those of the first preferred embodiment.

The cover member 13 shown in FIG. 14A has the thick-film resistor 13F and the wiring pattern 13G thereof instead of the shield electrode layer 13C. To fabricate the cover member 13, a predetermined number of top ceramic green sheets (not shown) are fabricated, a via hole is formed in a predetermined one of the top ceramic green sheets in a predetermined pattern, and the via hole is filled with the conductive paste, so as to provide an unfired via conductor in the ceramic green sheet. The conductive paste is printed in a predetermined pattern to provide an unfired in-plane conductor. Then, resistor paste is printed to form an unfired thick-film resistor. For example, the resistor paste may be the known resistor material such as a resistor material mainly consisting of ruthenium oxide. After the shrinkage-suppression sheet having an unfired leg portion and the shrinkage-suppression sheet having no unfired leg portion are fabricated in a manner similar to the first preferred embodiment, the top ceramic green sheet and the shrinkage-suppression sheets are superposed to fabricate a composite laminated body in a manner similar to the first preferred embodiment, and the composite laminated body is fired to fabricate the cover member 13. As shown in FIG. 14A, the cover member 13 includes the thick-film resistor 13F and the wiring pattern 13G.

After firing, a laser beam irradiates the thick-film resistor 13F of the cover member 13 so as to obtain a desired resistance.

With the preferred embodiment shown in FIG. 14A, a resistor chip, which is typically required to be mounted on the wiring board 11, is embedded in the cover member 13 as the thick-film resistor 13F. Accordingly, the resistor chip is not required to be mounted on the wiring board 11, and an expected mounting area for the resistor chip may be saved. Thus, the electronic component can be miniaturized, and the high-density performance can be provided. With this preferred embodiment, the cover member 13 that enables the reduction in height of the electronic component can be obtained similar to the fourth preferred embodiment.

While the preferred embodiment shown in FIG. 14A describes the case in which the thick-film resistor 13F and the wiring pattern 13G thereof are provided in the top portion 13A of the cover member 13, the shield electrode layer 13C of the cover member 13 may be provided with the thick-film resistor 13F and the wiring pattern 13G as shown in FIGS. 14B to 14D. In the case of the cover member shown in the FIGS. 14B to 14D, the cover member may be fabricated in a manner similar to the first preferred embodiment except that the number of ceramic green sheets is incremented by one for forming the thick-film resistor 13F and the wiring pattern 13G in addition to the shield electrode layer 13C. Therefore, the description of the fabricating procedure of the cover member as shown in FIGS. 14B to 14D is omitted.

The shield electrode layer 13C, the thick-film resistor 13F, and the wiring pattern 13G thereof are provided in the top portion 13A of the cover member 13 as shown in FIG. 14B. The thick-film resistor 13F and the wiring pattern 13G are disposed above the shield electrode layer 13C. Trimming of the thick-film resistor 13F is performed such that the laser beam irradiates the thick-film resistor 13F from the upper side of the top portion 13A.

In the case of the cover member 13 shown in FIG. 14C, the shield electrode layer 13C is provided on the upper surface of the top portion 13A, and the thick-film resistor 13F and the wiring pattern 13G are provided in the top portion 13A. An opening 13E for trimming is provided in the shield electrode layer 13C at a portion directly above the thick-film resistor 13F, so that the laser beam irradiates the thick-film resistor 13F from the upper side of the top portion 13A for reliably trimming the thick-film resistor 13F.

In the case of the cover member 13 shown in FIG. 14D, the shield electrode layer 13C, the thick-film resistor 13F, and the wiring pattern 13G thereof are provided in the top portion 13A of the cover member 13. The thick-film resistor 13F and the wiring pattern 13G thereof are disposed below the shield electrode layer 13C. An opening 13E for trimming is provided in the shield electrode layer 13C at a portion directly above the thick-film resistor 13F, so that the laser beam irradiates the thick-film resistor 13F from the upper side of the top portion 13A for reliably trimming the thick-film resistor 13F.

With this preferred embodiment shown in FIGS. 14B to 14D, the electronic component can be miniaturized and is highly functional. In addition, advantages similar to those of the first preferred embodiment can be provided.

SEVENTH PREFERRED EMBODIMENT

Figure 15A:
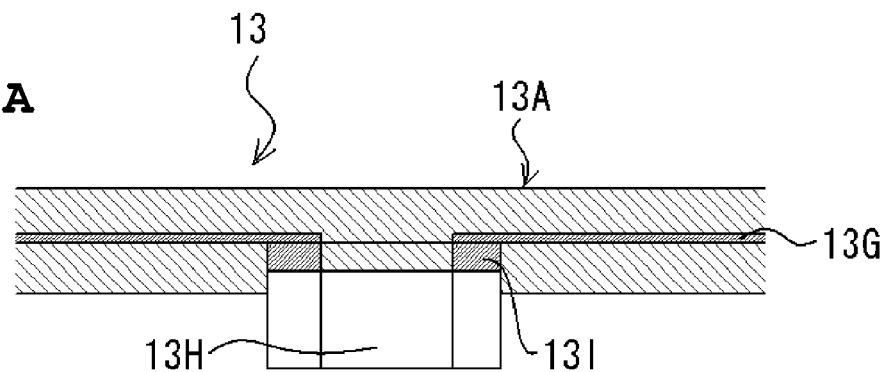
FIGS. 15A to 15C are cross-sectional views each showing a primary portion of an electronic component according to a yet further preferred embodiment of the present invention.
Figure 15B:
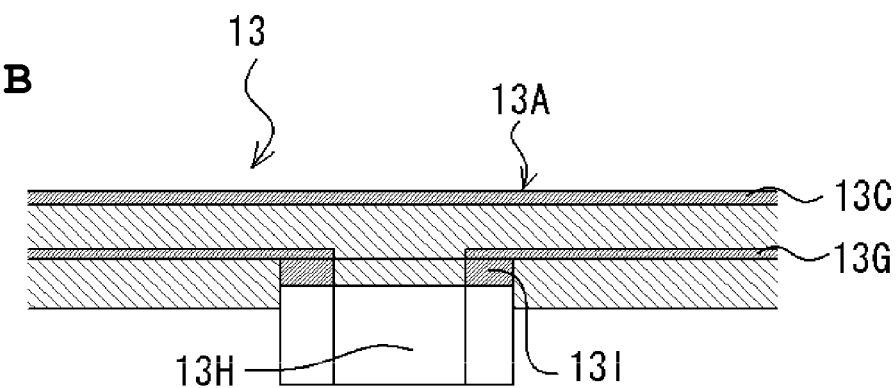
Figure 15C:
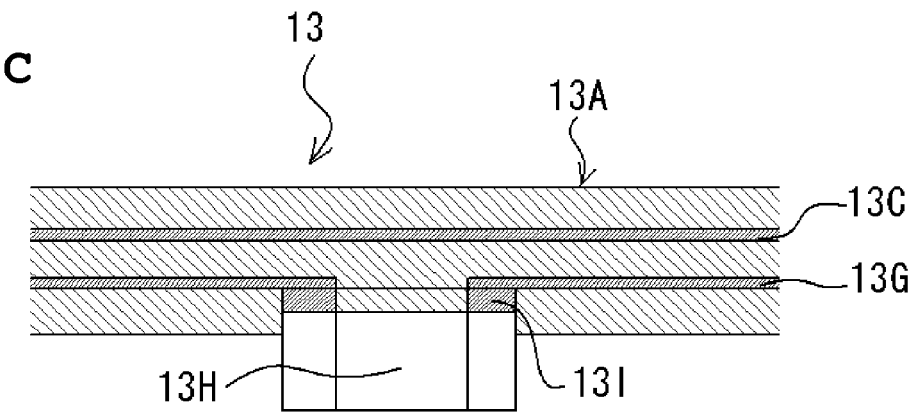

An electronic component of this preferred embodiment is similar to that of the preferred embodiment shown in FIGS. 14A, 14C and 14D except that a chip ceramic electronic component 13H is provided as shown in FIGS. 15A to 15C instead of the thick-film resistor 13F of the sixth preferred embodiment. The chip ceramic electronic component 13H has a ceramic sintered body as an element body, and external terminal electrodes are provided on both sides of the element body. An example of the chip ceramic electronic component 13H may be a passive electronic component, such as a laminated ceramic capacitor, or a laminated inductor. The cover member 13 of this preferred embodiment may be fabricated in a manner similar to that of the first preferred embodiment. In this preferred embodiment, the same numerals refer the same portions as those of the first preferred embodiment or portions corresponding to those of the first preferred embodiment.

The cover member 13 shown in FIG. 15A includes the chip ceramic electronic component 13H instead of the thick-film resistor 13F as shown in FIG. 14A. The chip ceramic electronic component 13H is connected to the wiring pattern 13G from the lower side of the top portion 13A of the cover member 13.

To fabricate the cover member 13, a predetermined unfired wiring pattern (an unfired in-plane conductor and an unfired via conductor) is formed at a top ceramic green sheet in a manner similar to the sixth preferred embodiment. A predetermined number of top ceramic green sheets are superposed on a shrinkage-suppression ceramic green sheet, so as to provide a laminated body with unfired lands exposed at the upper surface of the laminated body in a predetermined pattern. Then, an organic adhesive is applied on the upper surface of the laminated body by spraying or other suitable method to form an organic adhesive layer, the chip ceramic electronic component 13H is mounted on the unfired lands by using a mounter (not shown), and the chip ceramic electronic component 13H is bonded and fixed to the unfired lands. A shrinkage-suppression ceramic green sheet having unfired leg portions is superposed and pressed thereon to provide a composite laminated body. Due to the pressing, the chip ceramic electronic component 13H is partially embedded into the upper surface of the laminated body with the unfired lands. By firing the composite laminated body, the external terminal electrodes of the chip ceramic electronic component 13H are co-fired with lands 13I, so that the cover member 13 (see FIG. 15A) with the chip ceramic electronic component 13H partially embedded may be fabricated. The embedded distance of the chip ceramic electronic component 13H relative to the top portion 13A is preferably at least about 1 μm, and more particularly, in a range of about 1 μm to about 200 μm.

With this preferred embodiment, the chip ceramic electronic component 13H mounted at the cover member 13 is embedded into the lower surface of the top portion 13A. Accordingly, even though heating processing such as reflowing is performed when the cover member 13 is mounted on the wiring board 11 and fixed thereto, the connection portion between the chip ceramic electronic component 13H and the lands is not deteriorated, and the connection reliability is assured for a long duration. In addition, advantages similar to those of the first preferred embodiment are provided.

In the case of the cover member 13 shown in FIG. 15B, the shield electrode layer 13C is provided on the upper surface of the top portion 13A, the wiring pattern 13G is provided in the top portion 13A, and the chip ceramic electronic component 13H is connected to the wiring pattern 13G in a manner similar to the case shown in FIG. 15A.

In the case of the cover member 13 shown in FIG. 15C, the shield electrode layer 13C, and the wiring pattern 13G for the chip ceramic electronic component 13H are provided in the top portion 13A. The wiring pattern 13G is disposed below the shield electrode layer 13C. The chip ceramic electronic component 13H is connected to the wiring pattern 13G in a manner similar to the case shown in FIG. 15A.

With this preferred embodiment shown in FIGS. 15B and 15C, the connection reliability of the chip ceramic electronic component 13H can be assured for a long duration, and the chip ceramic electronic component 13H can be reliably protected from the external magnetic field environment. In addition, advantages similar to those of the first preferred embodiment are provided.

Figure 16A:
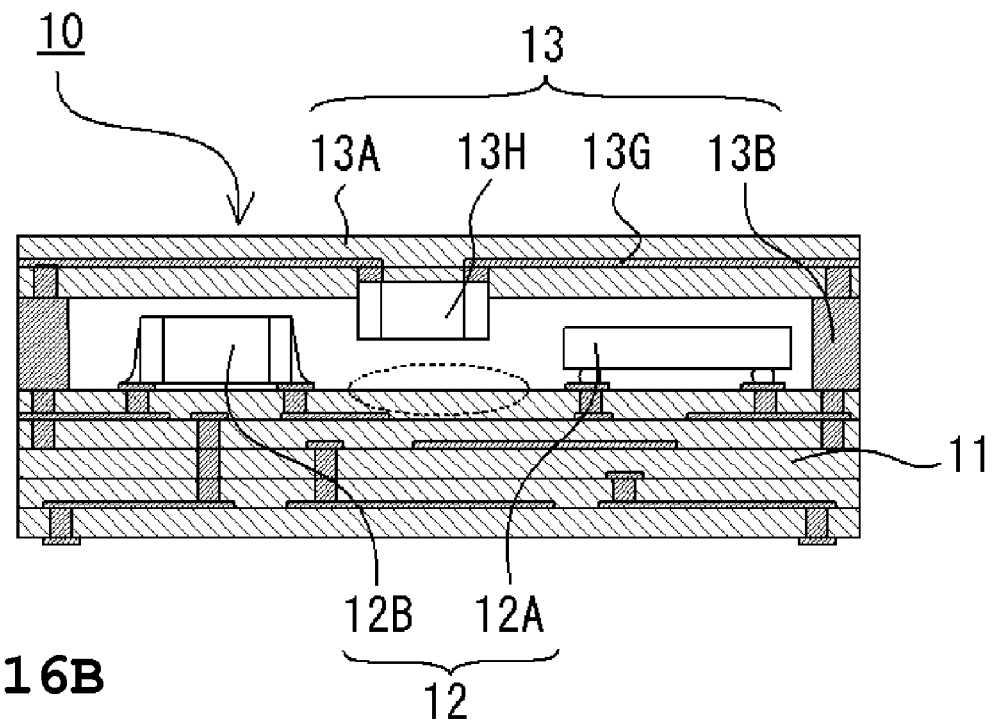
FIGS. 16A and 16B are cross-sectional views each showing an electronic component using the cover member shown in FIG. 15A.
Figure 16B:
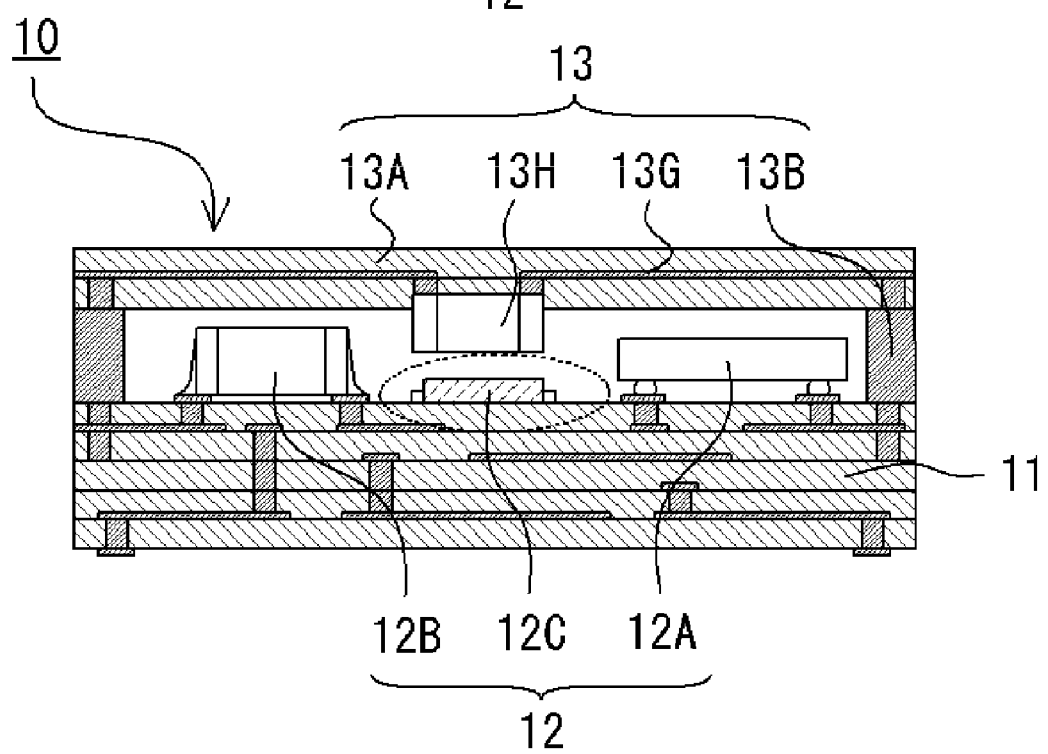
Figure 17A:
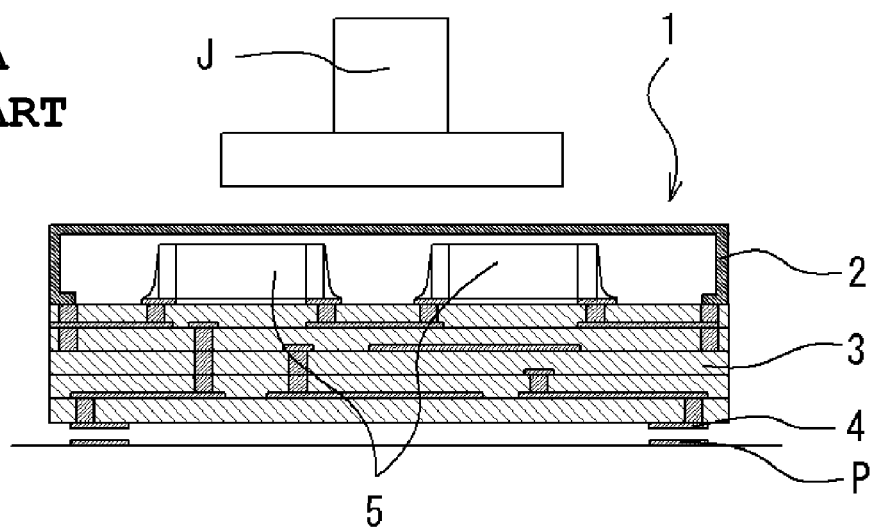
FIGS. 17A and 17B are cross-sectional views each showing an electronic component of a related art.
Figure 17B:
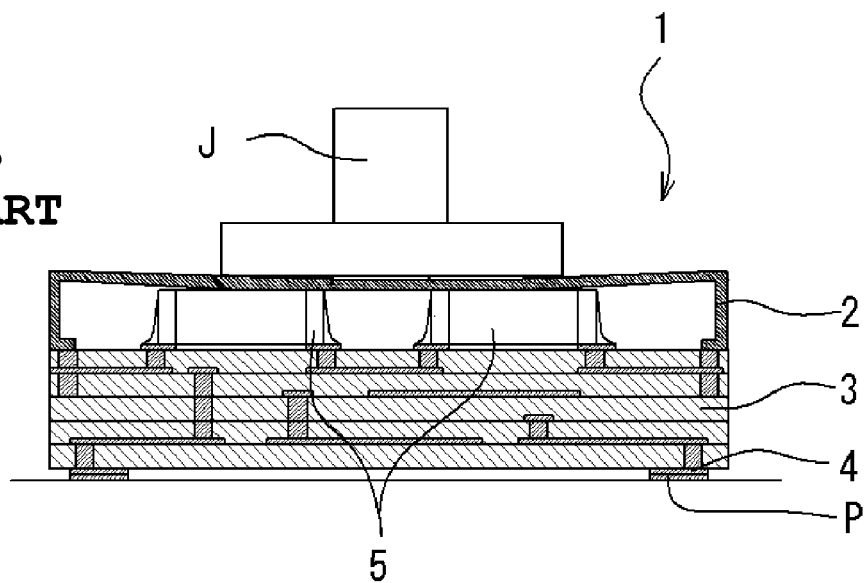
Figure 18A:
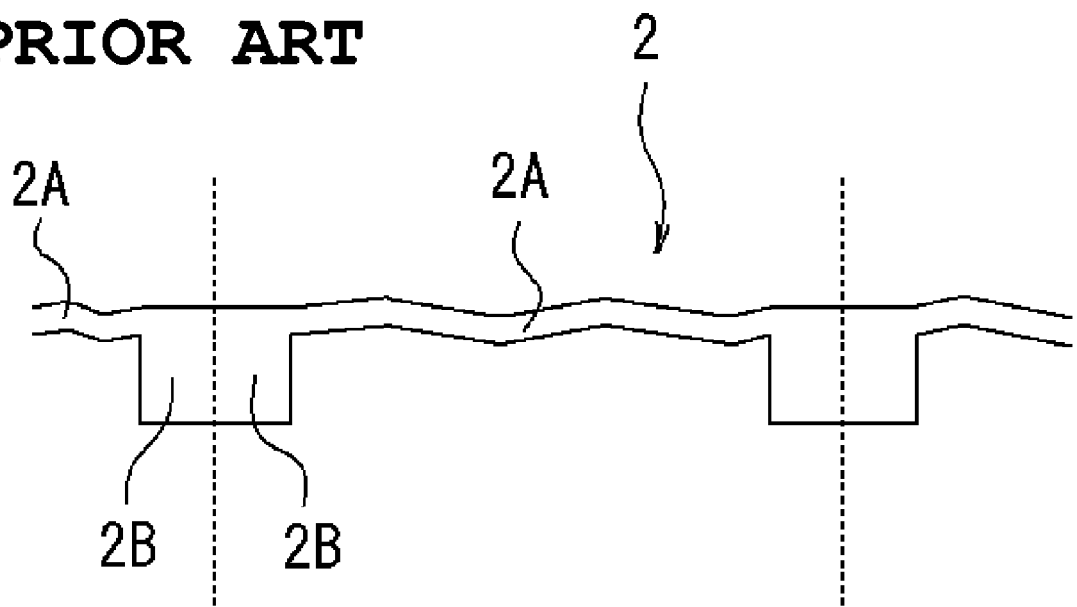
FIGS. 18A and 18B are cross-sectional views each showing a primary step of a fabricating procedure of a cover member of an electronic component according to another related art.
Figure 18B:
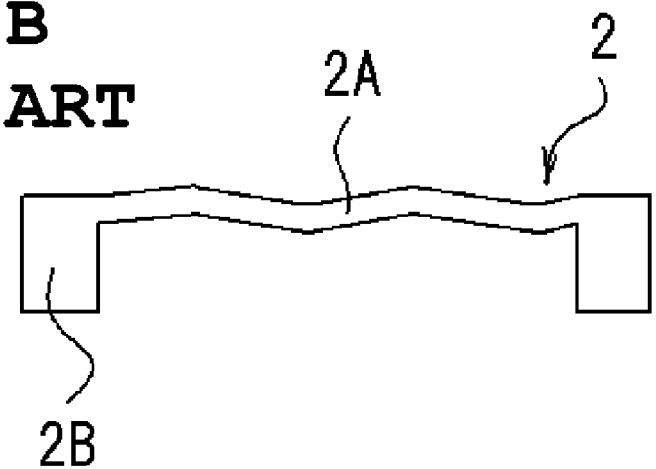

In the case where the cover member 13 shown in FIGS. 15A to 15C is mounted on the wiring board 11, a surface mount device 12 should not be provided at an area on the wiring board 11 facing the chip ceramic electronic component 13H as shown in FIG. 16A. Accordingly, short-circuiting can be prevented from occurring at the chip ceramic electronic component 13H on the wiring board 11 even if the top portion 13A of the cover member 13 bends due to a jig during the characteristic screening of the electronic component 10. If a surface mount device 12 is still mounted, the surface mount device 12C sealed with the resin may be mounted at the area on the wiring board 11 facing the chip ceramic electronic component 13H as shown in FIG. 16B. As long as the surface mount device 12C is sealed with the resin, the short-circuiting does not occur even when the top portion 13A of the cover member 13 bends and the chip ceramic electronic component 13H comes into contact with the surface mount device 12C. Thus, the characteristic of the electronic component can be evaluated accurately.

Note that the present invention is not limited to the above-described preferred embodiments, and may include modifications within the scope of the present invention.

The present invention can be used preferably as an electronic component for various electronic equipment.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component comprising:
   a wiring board having a wiring pattern;
   surface mount devices mounted on a main surface of the wiring board; and
   a cover member arranged to cover the surface mount devices; wherein
   the cover member includes a top portion made of a flat ceramic member, and a leg portion made of a metal columnar member having a height that is substantially equal to heights of the surface mount devices;
   the top portion has a multilayered structure in which a plurality of ceramic layers are laminated;
   a shield electrode layer is disposed at at least one of an interlayer and an outer surface of the multilayered structure; and
   a via conductor is arranged to extend between and to electrically connect the metal columnar member and the shield electrode layer.

2. The electronic component according to claim 1, wherein the columnar member is a columnar metal member that is co-fired and integral with the flat ceramic member.

3. The electronic component according to claim 2, wherein the shield electrode layer is connected to the columnar metal through a via conductor provided at the ceramic layers.

4. The electronic component according to claim 3, wherein the shield electrode layer and the columnar metal are integral with each other and co-fired.

5. The electronic component according to claim 3, wherein an opening is provided at a portion of the shield electrode layer that faces at least one of the surface mount devices.

6. The electronic component according to claim 1, wherein a thick-film resistor is disposed at at least one of an interlayer and an outer surface of the multilayered structure, and the thick-film resistor is connected to the columnar metal through a via conductor provided at the ceramic layers.

7. The electronic component according to claim 6, wherein an opening is provided at a portion of the shield electrode layer that faces the thick-film resistor.

8. The electronic component according to claim 1, wherein the top portion includes a chip ceramic electronic component having a ceramic sintered body as an element body thereof and a terminal electrode, and at least a portion of the chip ceramic electronic component is embedded in the top portion.

9. The electronic component according to claim 1, wherein the wiring board is provided as a ceramic multilayered board in which a plurality of first low temperature co-fired ceramic layers are laminated, and a wiring pattern primarily including a material selected from silver and copper is provided at an interlayer of the ceramic multilayered board.

10. The electronic component according to claim 9, wherein the top portion has a laminated structure in which a plurality of second low temperature co-fired ceramic layers are laminated, and the second low temperature co-fired ceramic layers and the first low temperature co-fired ceramic layers have substantially the same material composition.

* * * * *